(12) United States Patent
Pendse

(10) Patent No.: US 8,853,001 B2
(45) Date of Patent: Oct. 7, 2014

(54) SEMICONDUCTOR DEVICE AND METHOD OF FORMING PAD LAYOUT FOR FLIPCHIP SEMICONDUCTOR DIE

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/959,709

(22) Filed: Dec. 3, 2010

(65) Prior Publication Data
US 2011/0074047 A1  Mar. 31, 2011
US 2012/0241984 A9  Sep. 27, 2012

Related U.S. Application Data

(60) Continuation-in-part of application No. 12/432,137, filed on Apr. 29, 2009, now Pat. No. 8,129,837, which (Continued)

(51) Int. Cl.
*H01L 23/48* (2006.01)
*H01L 23/00* (2006.01)

(Continued)

(52) U.S. Cl.
CPC . *H01L 23/49838* (2013.01); *H01L 2224/48157* (2013.01); *H01L 24/13* (2013.01);

(Continued)

(58) Field of Classification Search
USPC ............... 257/778, 787, 691; 361/735, 760; 438/111
See application file for complete search history.

(56) References Cited

U.S. PATENT DOCUMENTS 5,866,949 A * 2/1999 Schueller ...................... 257/778
6,407,462 B1 * 6/2002 Banouvong et al. .......... 257/787

(Continued)

FOREIGN PATENT DOCUMENTS

JP  9097791 A  4/1997
JP  09237853 A  9/1997

(Continued)

*Primary Examiner* — Nathan Ha
(74) *Attorney, Agent, or Firm* — Robert D. Atkins; Patent Law Group: Atkins and Associates, P.C.

(57) ABSTRACT

A semiconductor device has a semiconductor die with a die pad layout. Signal pads in the die pad layout are located primarily near a perimeter of the semiconductor die, and power pads and ground pads are located primarily inboard from the signal pads. The signal pads are arranged in a peripheral row or in a peripheral array generally parallel to an edge of the semiconductor die. Bumps are formed over the signal pads, power pads, and ground pads. The bumps can have a fusible portion and non-fusible portion. Conductive traces with interconnect sites are formed over a substrate. The bumps are wider than the interconnect sites. The bumps are bonded to the interconnect sites so that the bumps cover a top surface and side surfaces of the interconnect sites. An encapsulant is deposited around the bumps between the semiconductor die and substrate.

31 Claims, 30 Drawing Sheets

Related U.S. Application Data is a continuation of application No. 11/372,989, filed on Mar. 10, 2006, now Pat. No. 7,605,480, which is a division of application No. 10/983,898, filed on Nov. 8, 2004, now Pat. No. 7,034,391.

(60) Provisional application No. 60/518,434, filed on Nov. 8, 2003.

(51) Int. Cl.
  H01L 23/498 (2006.01)
  H01L 23/50 (2006.01)
  H01L 21/56 (2006.01)
  H01L 23/31 (2006.01)

(52) U.S. Cl.
  CPC ............... H01L 2924/19041 (2013.01); H01L 2224/13155 (2013.01); H01L 2924/0105 (2013.01); H01L 2924/14 (2013.01); H01L 2224/48105 (2013.01); H01L 2924/1433 (2013.01); H01L 24/48 (2013.01); H01L 2224/27013 (2013.01); H01L 2224/48091 (2013.01); H01L 2924/01049 (2013.01); H01L 2924/01322 (2013.01); H01L 24/11 (2013.01); H01L 2224/812 (2013.01); H01L 2924/01027 (2013.01); H01L 2924/01074 (2013.01); H01L 2924/15311 (2013.01); H01L 2224/13016 (2013.01); H01L 2224/274 (2013.01); H01L 2924/014 (2013.01); H01L 2224/48158 (2013.01); H01L 2924/01082 (2013.01); H01L 2924/3011 (2013.01); H01L 2224/48227 (2013.01); H01L 2924/00013 (2013.01); H01L 2924/01015 (2013.01); H01L 2924/01029 (2013.01); H01L 2224/4816 (2013.01); H01L 2224/73265 (2013.01); H01L 2224/73203 (2013.01); H01L 2924/01079 (2013.01); H01L 23/50 (2013.01); H01L 2224/32225 (2013.01); H01L 2224/81191 (2013.01); H01L 2224/81801 (2013.01); H01L 24/17 (2013.01); H01L 2224/13147 (2013.01); H01L 2224/32145 (2013.01); H01L 2224/16225 (2013.01); H01L 2224/73204 (2013.01); H01L 2924/3025 (2013.01); H01L 2924/13091 (2013.01); H01L 2224/1308 (2013.01); H01L 2924/01006 (2013.01); H01L 2924/01047 (2013.01); H01L 24/81 (2013.01); H01L 2924/01005 (2013.01); H01L 2224/13144 (2013.01); H01L 2924/01033 (2013.01); H01L 21/563 (2013.01); H01L 2224/13082 (2013.01); H01L 2924/01078 (2013.01); H01L 23/3128 (2013.01); H01L 2224/131 (2013.01); H01L 24/16 (2013.01); H01L 2924/01075 (2013.01); H01L 2224/13116 (2013.01); H01L 2924/01013 (2013.01); H01L 2224/13111 (2013.01)
  USPC .......................................... 438/108

(56) References Cited

U.S. PATENT DOCUMENTS

| | | | |
|---|---|---|---|
| 2006/0071225 | A1* | 4/2006 | Beeson et al. .................. 257/98 |
| 2010/0127370 | A1 | 5/2010 | Ozawa et al. |
| 2011/0241203 | A1 | 10/2011 | Nakasato et al. |

FOREIGN PATENT DOCUMENTS

| | | | |
|---|---|---|---|
| JP | 2002299512 | A | 10/2002 |
| JP | 2009231657 | A | 10/2009 |
| JP | 2010153831 | A | 7/2010 |
| WO | 2010067610 | A1 | 6/2010 |

* cited by examiner

SEMICONDUCTOR DEVICE AND METHOD OF FORMING PAD LAYOUT FOR FLIPCHIP SEMICONDUCTOR DIE

CLAIM TO DOMESTIC PRIORITY

The present application is a continuation-in-part of U.S. patent application Ser. No. 12/432,137, filed Apr. 29, 2009, now U.S. Pat. No. 8,129,837, which is a continuation of U.S. patent application Ser. No. 11/372,989, filed Mar. 10, 2006, now U.S. Pat. No. 7,605,480, which is a division of U.S. patent application Ser. No. 10/983,898, filed Nov. 8, 2004, now U.S. Pat. No. 7,034,391, which claims the benefit of U.S. Provisional Application No. 60/518,434, filed Nov. 8, 2003.

FIELD OF THE INVENTION

The present invention relates to semiconductor devices and, more particularly, to a semiconductor device and method of forming a pad layout for a flipchip semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

In a flipchip packages, a semiconductor die is typically mounted to a package substrate with the active side of the die facing the substrate. The interconnection of the circuitry in the semiconductor die with circuitry in the substrate is made by way of bumps which are attached to an array of interconnect pads on the die, and bonded to a corresponding complementary array of interconnect pads on the substrate.

The pads on the semiconductor die for the signal, power, and ground functions are conventionally distributed throughout the array, and the corresponding pads on the substrate are connected to appropriate circuitry to the external second level interconnects. The second level interconnects have a greater pitch than the flipchip interconnects, and so the routing on the substrate conventionally fans out. The fan-out routing between the pads on the semiconductor die and the external pins of the package is formed on multiple metal layers within the package substrate.

Multiple layer substrates are expensive and, in conventional flipchip constructs, the substrate alone typically accounts for more than half the package cost. The high cost of multilayer substrates has been a factor in limiting proliferation of flipchip technology in mainstream products. In conventional flipchip constructs, the escape routing pattern typically introduces additional electrical parasitics because the routing includes short runs of unshielded wiring and vias between wiring layers in the signal transmission path. Electrical parasitics can significantly limit package performance.

In a conventional flipchip package, the input/output pads, collectively the signal pads, on semiconductor die 13 are arranged in an area array substantially covering active surface 12 of the die, as shown in a plan view generally at 10 in FIG. 1. Signal pads 18 and 19, power pads 14, and ground pads 16, directed respectively to the signal, power and ground functions of semiconductor die 13, are distributed throughout the multiple rows and columns within the array. In particular, some of signal pads 18 are arranged on the perimeter of the array, while other signal pads 19 are not. Ordinarily, some design effort is made to arrange the pads so that the various signal pads are surrounded by, or at least adjacent to, power pads and/or ground pads.

Many conventional flipchip packages are made using ceramic substrates. Ceramic substrates can be made with a large number of layers relatively inexpensively, and blind vias can be made in ceramic layers without difficulty. In a conventional chip made for use with a conventional ceramic substrate, the pad pitch is typically in the range 150 micrometers (μm) to 250 μm, and a 225 μm grid pitch is typical of many chips.

The fan-out routing in the substrate, that is, the wiring on the substrate that connects the corresponding pads on the substrate with the external terminals of the package, is implemented in multiple metal layers patterned to provide the signal wiring and power and ground wiring. An arrangement of substrate pads corresponding to die pad layout 10 is shown in a plan view generally at 20 in FIG. 2. Signal pads 28 and 29, power pads 24, and ground pads 26 are arranged in a complementary array on substrate surface 22 so that they can receive and be bonded respectively to the signal, power, and ground bumps attached to the corresponding pads on the die. In the conventional arrangement, some of the pads 28 associated with signal routing are located at the perimeter of the array, while other pads 29 are not. The escape routing for the signal pads on the perimeter of the array can directly cross beneath die edge 23 as traces 30 in the uppermost metal layer of the substrate. Pads on the substrate that are not at the perimeter of the array are connected to deeper metal layers in the substrate by way of short traces and vias. Signal pads 29 are connected by way of short traces (signal stubs or jogs) 32 through signal vias 34 to signal traces in one of several metal layers beneath. Likewise, power pads 24 are connected by way of short traces (power stubs or jogs) 36 through power vias 38 to power traces in a metal layer beneath, and ground pads 26 are connected by way of short traces (ground stubs or jogs) 40 through ground vias 42 to power traces in a metal layer beneath.

In a typical conventional package having approximately 1000 external terminals, there are at least 2 or 3 layers of signal wiring and at least 4 or 5 layers of power and ground wiring in the substrate, which leads to a total number of layers of approximately 6 or 8 or more. As a general rule, an increase in number of signal wiring layers requires a concomitant increase in power and ground layers owing to the need to maintain a transmission line electrical environment in the package, which further increases the total layer count. The need for additional layers also results in longer signal paths, and many layer-to-layer vias, adding undesirable electrical parasitics and deterioration of performance.

SUMMARY OF THE INVENTION

A need exists for a die pad layout to accommodate the signal pads, as well as power pads and ground pads, needed for a flipchip semiconductor die while increasing routing density and minimizing the requisite number of interconnect layers. Accordingly, in one embodiment, the present invention is a method of making a semiconductor device comprising the steps of providing a semiconductor die having a die pad layout with signal pads located primarily in a perimeter region of the semiconductor die, and power pads and ground pads located primarily in an inboard region of the semiconductor die from the signal pads, forming a plurality of bumps over the signal pads, power pads, and ground pads, providing a substrate, and forming a plurality of conductive traces with interconnect sites over the substrate. The bumps are wider than the interconnect sites. The method further includes the steps of bonding the bumps to the interconnect sites so that the bumps cover a top surface and side surfaces of the interconnect sites, and depositing an encapsulant around the bumps between the semiconductor die and substrate.

In another embodiment, the present invention is a method of making a semiconductor device comprising the steps of providing a semiconductor die, providing a substrate, forming a plurality of conductive traces with interconnect sites over the substrate arranged in a layout with signal sites located near a perimeter of the substrate and power sites and ground sites located inboard from the signal sites, and forming an interconnect structure between the semiconductor die and substrate so that the interconnect structures cover a top surface and side surfaces of the interconnect sites.

In another embodiment, the present invention is a method of making a semiconductor device comprising the steps of providing a semiconductor die, providing a substrate, forming a plurality of conductive traces with interconnect sites over the substrate arranged in a layout with signal sites located primarily in a perimeter region of the substrate, and power sites and ground sites located primarily in an inboard region of the substrate from the signal pads, bonding the semiconductor die to the interconnect sites, and depositing an encapsulant between the semiconductor die and substrate.

In another embodiment, the present invention is a semiconductor device comprising a semiconductor die having a die pad layout with signal pads located primarily in a perimeter region of the semiconductor die, and power pads and ground pads located primarily in an inboard region of the semiconductor die from the signal pads. A plurality of conductive traces with interconnect sites is formed over a substrate. The semiconductor die is bonded to the interconnect sites. An encapsulant is deposited between the semiconductor die and substrate.

DETAILED DESCRIPTION OF THE DRAWINGS

Figure 1:
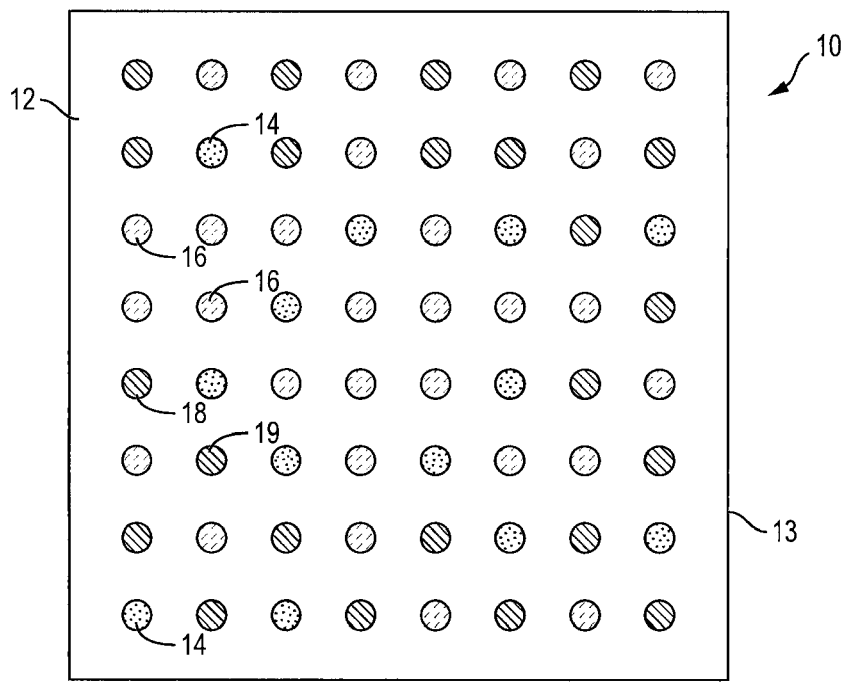
FIG. 1 illustrates in a plan view a conventional pad layout on a die for a flipchip package.
Figure 2:
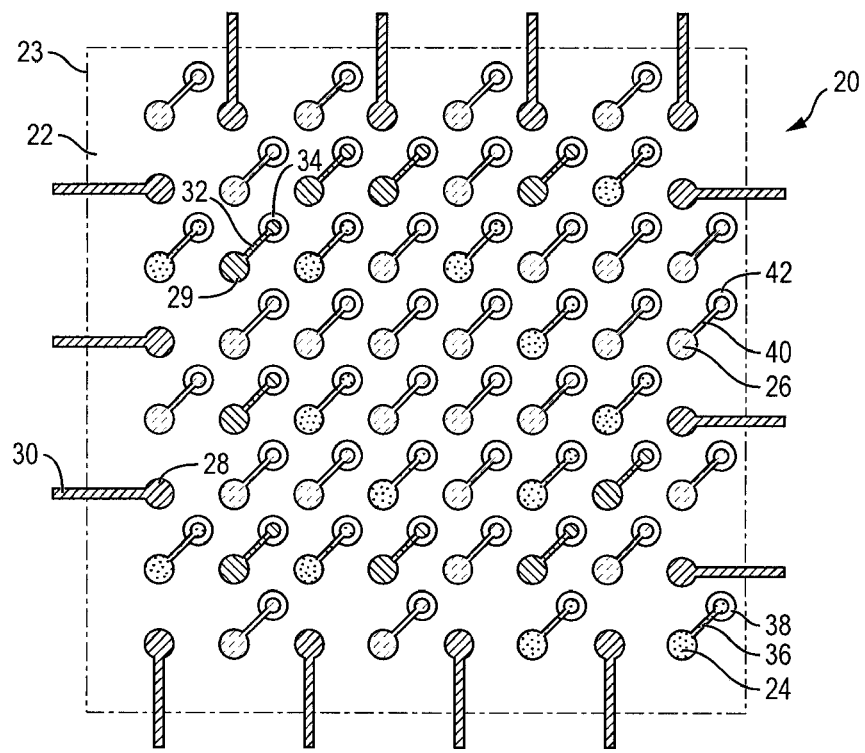
FIG. 2 illustrates in a plan view an arrangement of pads and routing on a flipchip substrate.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
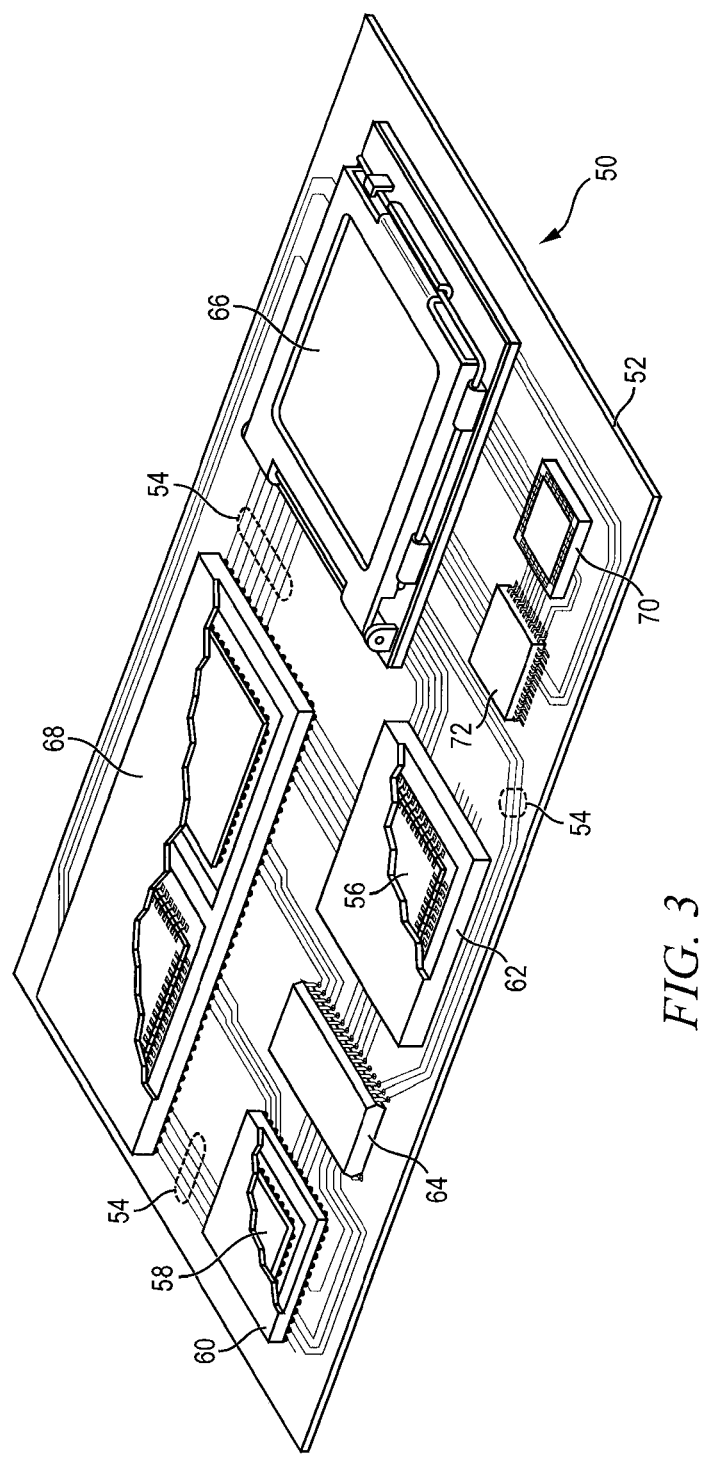
FIG. 3 illustrates a PCB with different types of packages mounted to its surface.

FIG. 3 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 3 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
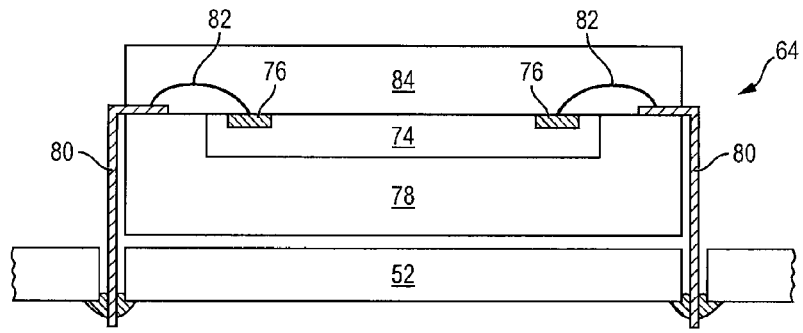
FIGS. 4a-4c illustrate further detail of the semiconductor packages mounted to the PCB.
Figure 4B:
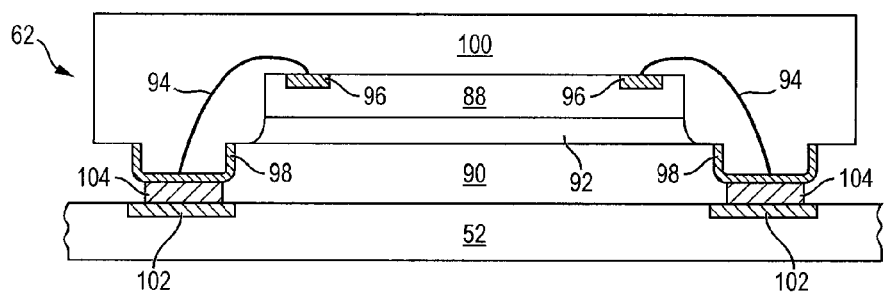
Figure 4C:
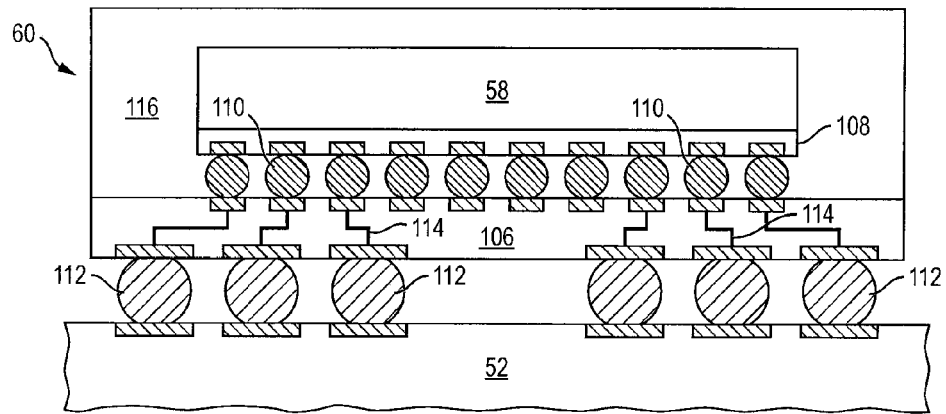

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 4b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, semiconductor die 58 can be mechanically and electrically connected directly to PCB 52 using flipchip style first level packaging without intermediate carrier 106.

In a flipchip interconnect pad layout, all or substantially all the signal pads are situated in the marginal part of the semiconductor die and corresponding package substrates. The die signal pads are arranged on the die surface near the perimeter of the semiconductor die, and the die power and ground pads are arranged on the die surface inboard from the signal pads. The signal pads on the corresponding package substrate are arranged in a manner complementary to the die pad layout. The signal lines are routed from the signal pads beneath the die edge away from the die footprint, and the power and ground lines are routed to vias beneath the die footprint.

The pad layouts provide a high signal trace escape routing density at the chip margin. The package substrate has fewer metal layers, so that package constructed using the pad layout can be made at significantly lower cost. Because there are fewer metal layers, and because the number of vias is reduced or eliminated entirely from the signal transmission path, electrical parasitics are reduced and the package can have improved performance.

A die pad layout for flipchip interconnect can have signal pads located primarily near the perimeter of the semiconductor die, and ground and power pads located primarily inboard from the signal pads. The signal pads can be arranged in a row generally parallel to the die edge. Alternatively, the signal pads are arranged in an array of two or more rows parallel to the die edge. In some embodiments, the pads in adjacent rows are staggered. The area of the semiconductor die on which the row or array of signal pads is disposed is referred to as a peripheral region of the die.

In other embodiments, the ground and power pads are arranged in a rectangular array near the center of the semiconductor die. Alternatively, a central area of the semiconductor die has no pads. The power and ground pads can also be arranged in a row parallel to the die edge near the signal pads, or in an array of two or more rows parallel to the die edge near the signal pads. The area of the semiconductor die on which the row or array of power and ground pads is disposed is referred to as an inboard region of the die.

Figure 5:
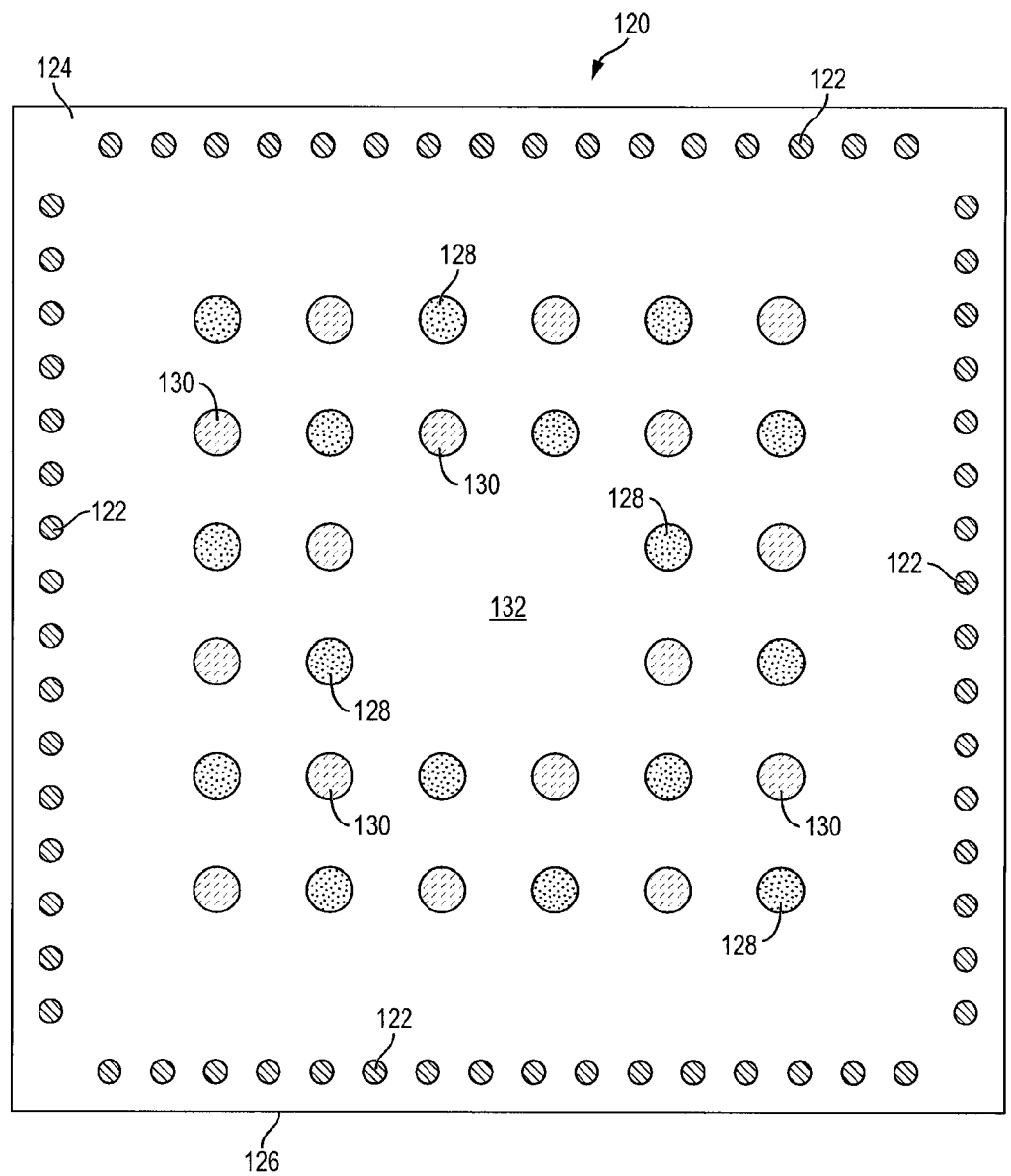
FIG. 5 illustrates a pad layout on a die for a flipchip package.

FIG. 5 shows an embodiment of die pad layout 120. Signal pads 122 are arranged on die surface 124 near the perimeter of the semiconductor die in rows parallel to die edges 126. Signal pads 122 have a finer pitch than the pads in the conventional mixed pad array of FIG. 1. Power pads 128 and ground pads 130 are arranged in an array on an inboard area of die surface 124. A central area 132 of die surface 124 is free of all pads, including power pads 128 and ground pads 130.

Figure 6:
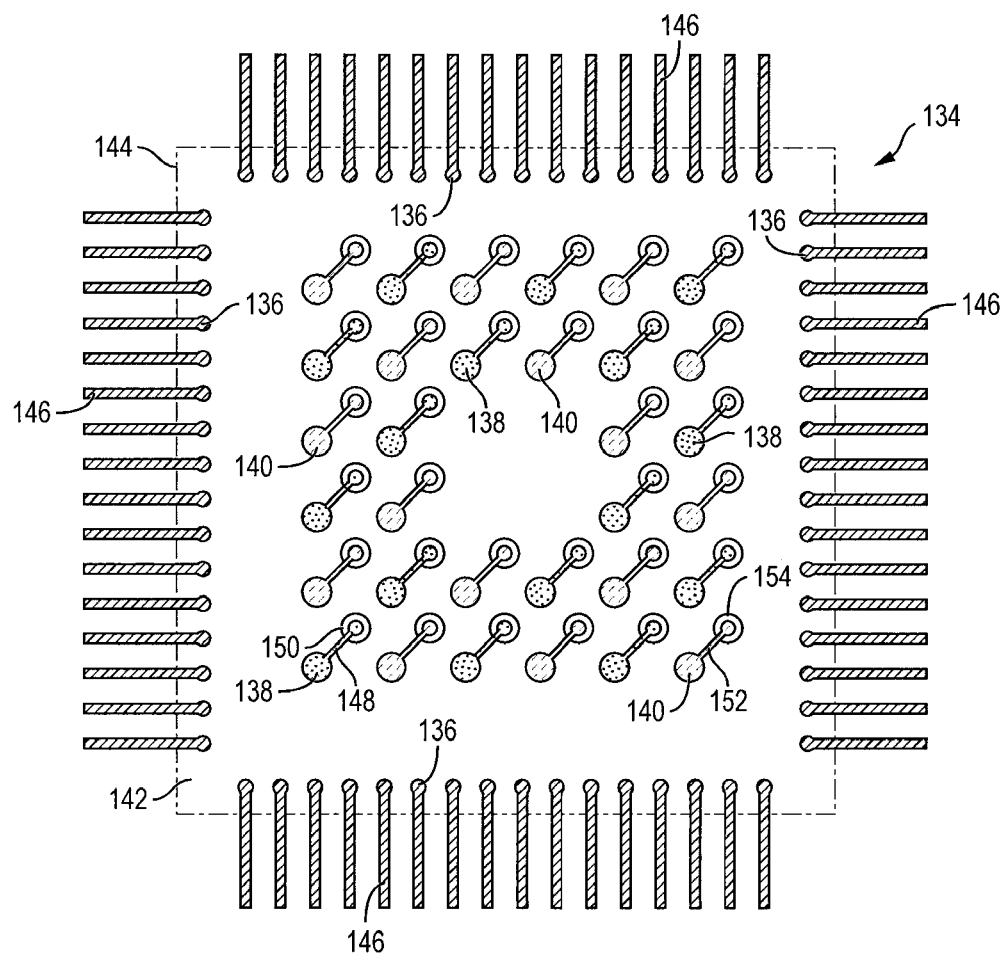
FIG. 6 illustrates an arrangement of pads and routing on a flipchip substrate.

An arrangement of substrate pads corresponding to die pad layout 120 of FIG. 5 is shown in a plan view generally at 134 in FIG. 6. Signal pads 136, power pads 138, and ground pads 140 are arranged in a complementary array on substrate surface 142 so that they can receive and be bonded respectively to the signal, power and ground bumps attached to the corresponding pads on the semiconductor die. In this arrangement, all the pads 136 associated with signal routing are located at the perimeter of the array, and escape routing for the signal pads on the perimeter of the array can directly cross beneath die edge 144 as traces 146 in the uppermost metal layer of the substrate. Signal pads 136 and power pads 138 on the substrate, which are not at the perimeter of the array, are connected to deeper metal layers in the substrate by way of short traces and vias. Power pads 138 are connected by way of short traces (power stubs or jogs) 148 through power vias 150 to power traces in a metal layer beneath, and ground pads 140 are connected by way of short traces (ground stubs or jogs) 152 through ground vias 154 to power traces in a metal layer beneath.

In FIGS. 5 and 6, all the signal lines are routed from signal pads 136, passing away from the die footprint, and all the power and ground lines are routed to vias beneath the die footprint. Accordingly, no stubs or vias are required in the signal path, and parasitics in signal transmission are avoided. The signal traces can be routed as close together as available techniques for trace formation allow, although if they are made too close, signal interference can occur in adjacent lines. Signal pads 136 can be made as close together as available techniques for trace formation and bump bonding allow.

Figure 7:
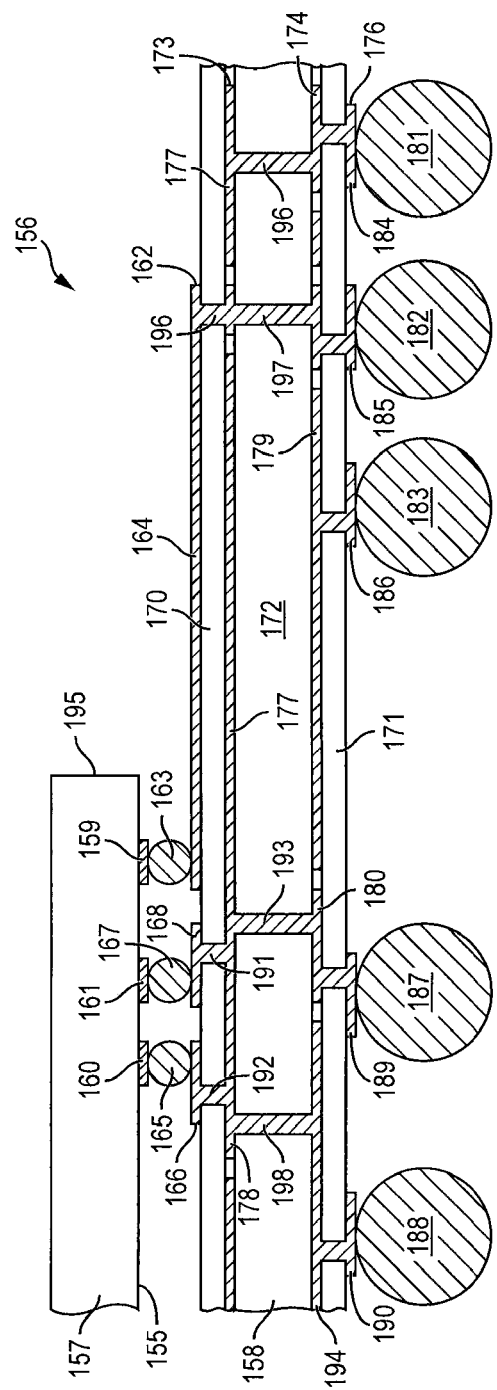
FIG. 7 illustrates a portion of a flipchip mounted on a substrate having a die pad layout and substrate pad arrangement.

FIG. 7 shows a portion of flipchip package 156 having a semiconductor die 157 mounted on a die attach region of a surface of substrate 158. The die pads, including signal pads 159, power pads 160, and ground pads 161, are formed on or in active side 155 of semiconductor die 157. Conductive balls or bumps are attached to the die pads, and flipchip interconnection to substrate 158 is made by bonding the balls or bumps onto interconnect sites on corresponding patterned traces in the upper metal layer 162 of the substrate. Signal bump 163 is attached to signal pad 159 and bonded to interconnect sites on signal traces 164. Power bump 165 is attached to power pad 160 and bonded to interconnect sites on power traces 166, and ground bump 167 is attached to ground pad 161 and bonded to interconnect sites on ground traces 168.

Substrate 158 can be a build-up type substrate, having one or more thinner alternating dielectric and metal layers affixed onto each of the upper and lower surfaces of a thicker middle two-layer substrate, referred to as the core. The build-up substrate 158 typically has the same number of single metal layers on the top as on the bottom. Thus, a 1-2-1 build-up substrate has one thinner single metal layer affixed, with a dielectric layer, onto each the top and bottom of the core, making four metal layers in all. A 2-2-2 build-up substrate has two thinner single metal layers affixed, with dielectric layers, onto each the top and bottom of the core, making six metal layers in all. A 3-2-3 build-up substrate has three thinner single metal layer substrates affixed, with dielectric layers, onto each the top and bottom of the core, making eight metal layers in all. Each additional set of build-up layers significantly raises the cost of the build-up substrate, and circuitry layouts that require fewer layers are accordingly desirable.

The build-up process can entail applying a dielectric material in a layer upon the surface of the core, or on the surface of a previously established build-up layer by a spin-on process, then metallizing the surface of the dielectric and patterning the metallization by a mask and etch process.

Substrate 158 includes as a core a printed circuit board having patterned metal layers on top and bottom surfaces of a dielectric, i.e., a two metal layer substrate. The thickness of the dielectric in the printed circuit board is typically about 500 μm. As a practical matter, a feature pitch in the metal layers on the core has a lower limit in the range about 100 μm, and the vias capture pad diameter has a lower limit in the range about 300 μm. The thickness of the dielectric in the thinner single build-up layers, by contrast, is typically about 50 μm. The metal layer on the build-up layers is typically thinner than those on the thicker core. A feature pitch in the metal layers in the build-up layers has a lower limit in the range about 50 μm, and the vias capture pad diameter has a lower limit in the range about 120 μm.

Substrate 158 in the embodiment of FIG. 7 is a four-metal layer substrate of a build-up 1-2-1 type. That is, substrate 158 includes upper and lower thin single metal layer substrates 170 and 171 formed over middle thicker two metal layer substrate 172. The two metal layer substrate 172 has patterned upper and lower metal layers 173 and 174. The single metal layer substrates 170 and 171 have patterned metal layers 162 and 176. Each of the patterned metal layers 162, 173, 174, and 176 has traces for signal, power, and ground circuitry. For example, metal layer 173 includes traces 177 dedicated to ground circuitry and traces 178 dedicated to power circuitry, and metal layer 174 includes power traces 179 and ground traces 180.

Lower metal layer 176 is patterned to provide bonding sites for second level solder bump interconnection of the package at installation on a printed circuit board such as a motherboard of a device. Particularly, ground bumps 181, signal bumps 182, and power bumps 183 are attached to ground bump sites 184, signal bump sites 185, and power bump sites 186, arrayed on the margin of the underside of the package substrate 158. Core ground bumps 187 and core power bumps 188 are attached to core ground bump sites 189 and core power bump sites 190, arrayed beneath the die on the underside of the package substrate 158.

Upper ground traces 168 and power traces 166 include sites for flipchip attachment of ground and power bumps 167, 165, and are connected by vias 191 and 192 beneath the die footprint to traces 177 and 178 in metal layer 173. Traces 177 and 178 are connected by vias 198 and 193 to traces 180 and 194 in metal layer 174. Traces 180 and 194 are, in turn, connected by vias to the second level interconnection sites 189 and 190 (core ground and core power) and 184 and 186 (ground and power).

Die signal pads 159 are arranged near the perimeter of the semiconductor die, and the corresponding signal trace lines 164 on substrate 158 are routed beneath die edge 195 away from the die footprint. Signal traces 164 are routed directly to areas of substrate 158 generally overlying the second level signal bump sites 185, so that the connection of the signal traces in the upper metal layer 162 to bump sites 185 can be shortened and made principally by way of vias 196 and 197, with a minimum of signal circuitry within the lower metal layers 173, 174, and 176. The second level signal bumps and the vias running downward can be situated between and near ground and power bumps and vias.

Generally, ground lines in package substrates are preferably separated from signal lines by distances comparable to at least of the same order of magnitude as the distances between adjacent signal lines, so that field lines generated by signals go to ground rather than interfering with other signals. Preferably, therefore, the second metal layer 173 operates principally as a ground plane, and the thickness of the dielectric in the upper metal layer is about equal to or less than the minimum spacing between adjacent signal lines on the upper layer. Accordingly, much of the fan-out ground circuitry for package 156 is formed in the second metal layer 173, which is separated from the upper metal layer 162 only by the thin upper layer dielectric. The thickness of the dielectric in the upper and lower single metal layer substrates can be about 50 µm, and so where the nominal distance between adjacent signal lines is about 50 µm or greater, a desirable spacing of ground and signal lines is obtained to provide a stable microstrip-controlled impedance transmission line environment for the signals.

As discussed below, there are circumstances in which a small number of selected signal pads are located among ground and power pads in an inboard area of the die, that is, within the core circuitry region of the die. Where the design demands, or where the die circuitry makes it more preferable, a signal pad located among ground or power pads within the core circuitry region of the semiconductor die can have a corresponding pad on the substrate within the footprint of core circuitry region of the die and can be routed directly downward in a via through the substrate core more to a bottom layer.

Other build-up substrates can be employed, although as noted above the cost rises as additional layers are added, and substrates having fewer layers may be favored. Where a 2-2-2 substrate is used, the top and bottom build-up layers can be patterned much as is described above for a 1-2-1 substrate. The metal layers on the middle substrate can be employed primarily for power routing, and the metal layers on the build-up layers above and below the middle substrate can be employed principally as ground planes. Where greater number layers are employed in build-up substrates, the layout on the substrate layers can be arranged so that signal vias are, to the extent practicable, surrounded by ground and power vias, to reduce degradation of the signal by electrical parasitics.

A four-layer build-up type 0-4-0 laminate substrate can be used, without build-up layers, providing the feature pitch and via capture pad design fits within the coarse design rules of the core substrates. Avoiding the necessity of build-up can provide a significant cost reduction in laminate preparation.

Other die pad layouts can be made with die signal pads arranged near the perimeter of the die, and die power and ground pads arranged on inboard from the signal pads. In other layout arrangements, the signal pads are arranged in a manner complementary to the die pad layout, or with signal lines routed from the signal pads beneath the die edge away from the die footprint and power and ground lines routed to vias beneath the die footprint. FIGS. 8a-8b, 9a-9b, 10a-10b, and 11a-11b show four illustrative examples of pad layouts with corresponding substrates.

Figure 8A:
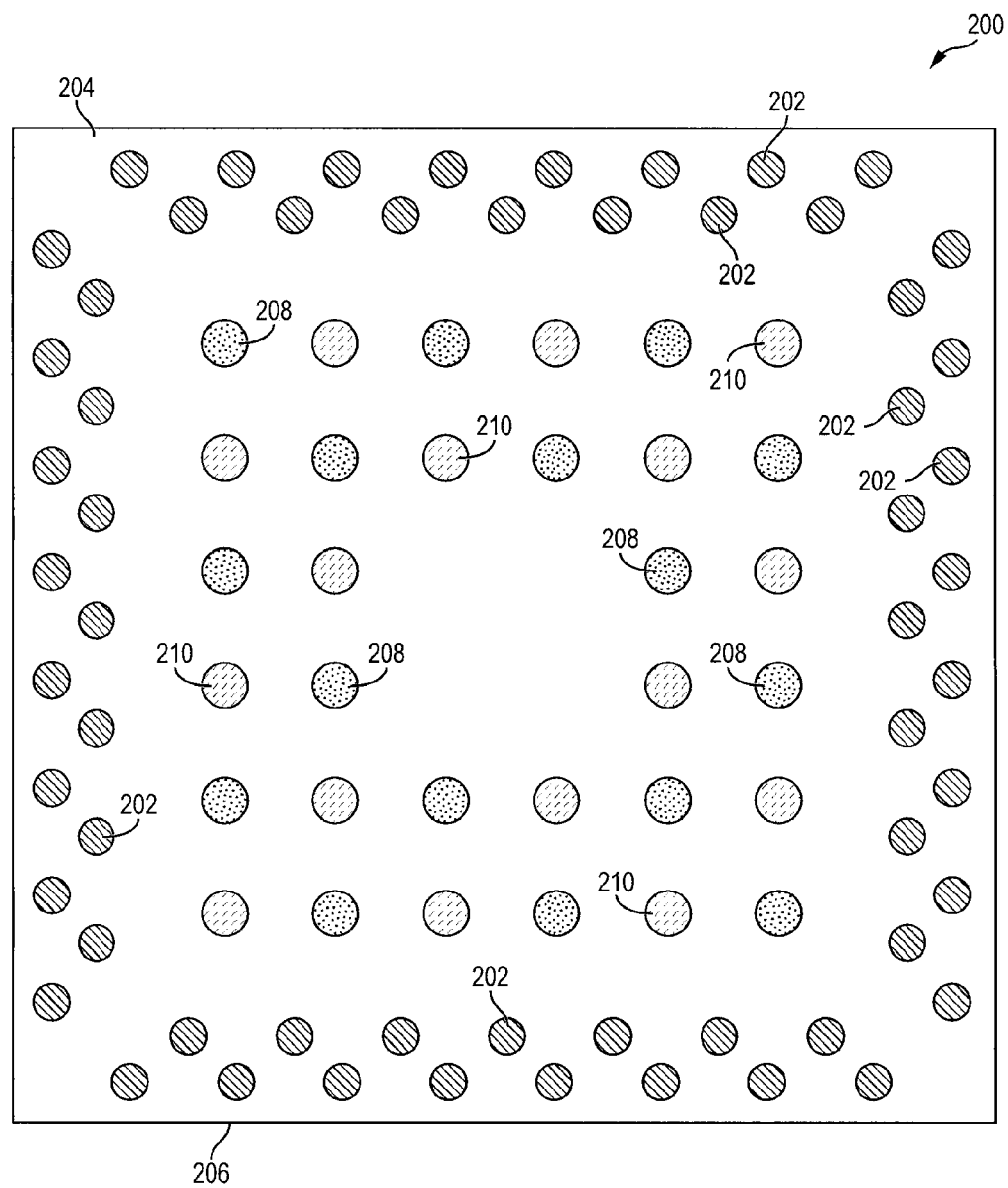
FIGS. 8a-8b illustrate a first pad layout on a die for a flipchip package.

In die pad layout 200 of FIG. 8a, signal pads 202 are arranged on die surface 204 near the perimeter of the semiconductor die, in an array of two staggered rows parallel to die edges 206. Signal pads 202 are shown having about the same pitch as the pads in a single row embodiment such as in FIG. 5 and, as a result, a much greater number of signal pads can be accommodated on the perimeter of the semiconductor die. Alternatively, the same number of pads as in a single row embodiment can be accommodated in two rows and staggered so that the pad pitch and pad diameter and the corresponding interconnect bumps or balls can be greater, reducing manufacture costs. Power pads 208 and ground pads 210 are arranged in an array having a central area free of pads on an inboard area of the die surface, similar to FIG. 5. It should be noted that many more die pads can be present in a typical die than are shown in the figures with some die having several hundred pads. For example, the semiconductor die can have a total of 500 pads, including 150 power and ground pads, and 350 signal pads.

Figure 8B:
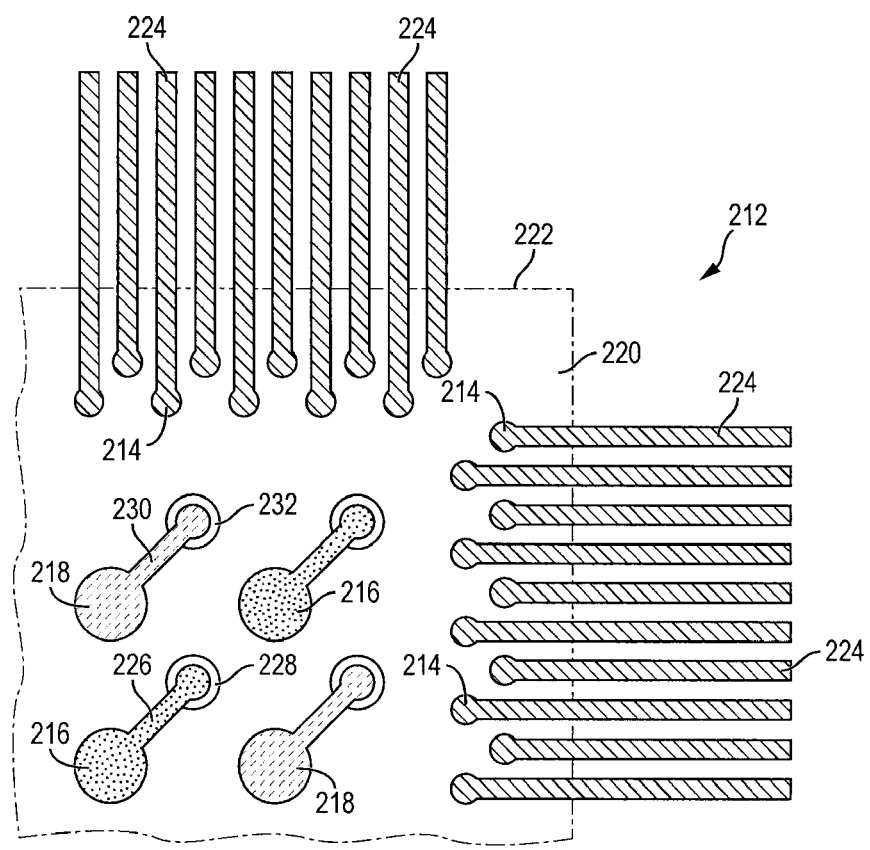

An arrangement of substrate pads corresponding to die pad layout 200 of FIG. 8a is shown in a plan view generally at 212 in FIG. 8b. Signal pads 214, power pads 216, and ground pads 218 are arranged on substrate surface 220 in an array complementary to the die pad layout of FIG. 8a, so that they can receive and be bonded respectively to the signal, power and ground bumps attached to the corresponding pads on semiconductor die 204. In this arrangement, all the pads 214 associated with signal routing are arranged in an array of two staggered rows at the perimeter of the array, and escape routing for the signal pads on the perimeter of the array can directly cross beneath die edge 222 as traces 224 in the uppermost metal layer of the substrate. Although signal pads 214 have about the same pitch as the pads in FIG. 6, signal traces 224 have about half the pitch as do signal traces 146. That is, the escape density can be doubled for a given pad pitch. Signal pads 214 and power pads 216 on substrate 220, which are not at the perimeter of the array, are connected to deeper metal layers in the substrate by way of short traces and vias. In FIG. 8b, power pads 216 are connected by way of power stubs or jogs 226 through power vias 228 to power traces in a metal layer beneath. Ground pads 218 are connected by way of ground stubs or jogs 230 through ground vias 232 to power traces in a metal layer beneath.

Figure 9A:
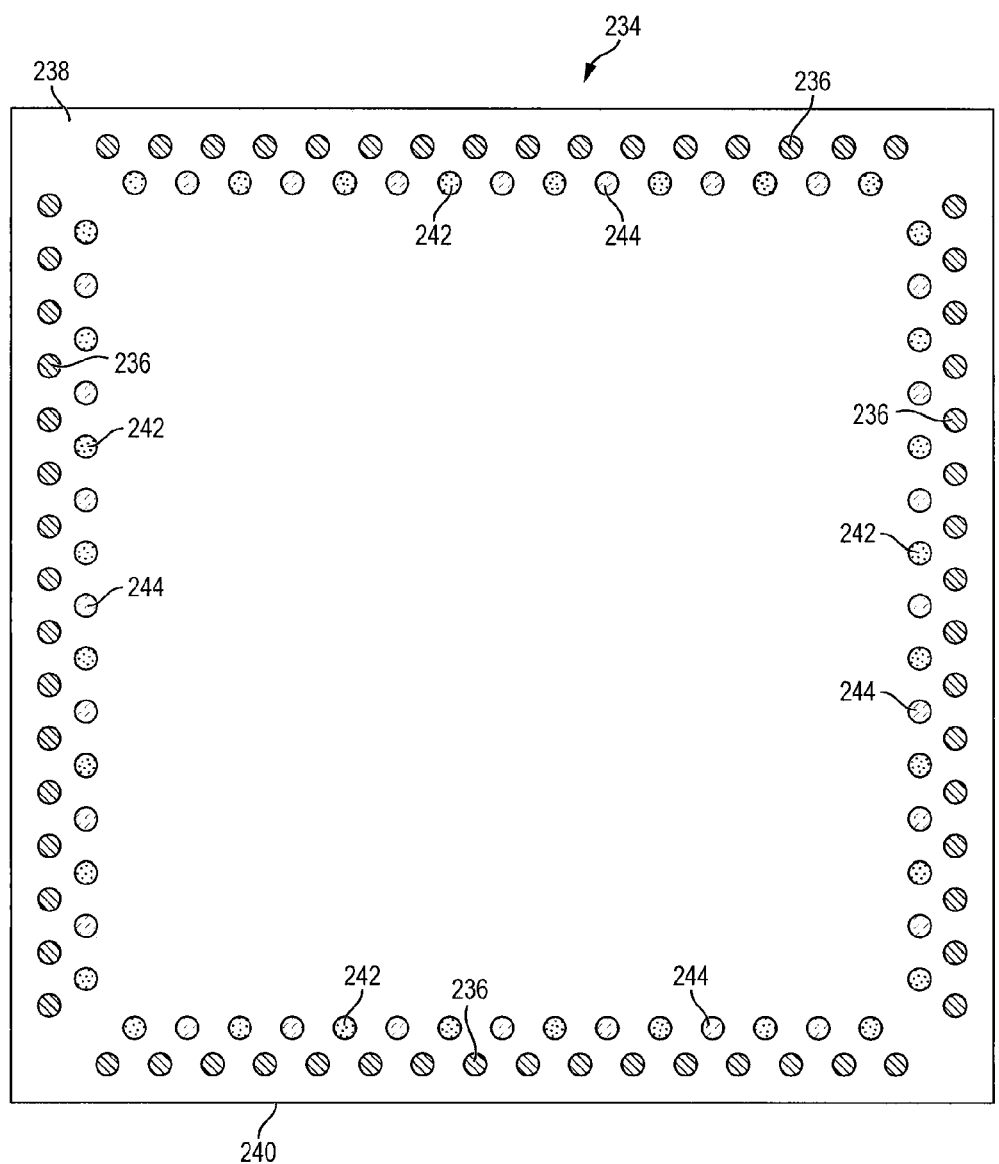
FIGS. 9a-9b illustrate a second pad layout on a die for a flipchip package.

FIG. 9a shows die pad layout 234 with signal pads 236 arranged on die surface 238 near the perimeter of the die, in a row parallel to die edges 240. Signal pads 236 are shown having about the same pitch as the pads in FIG. 5. Power pads 242 and ground pads 244 are also arranged in a row, parallel to die edge 240 and inboard of the row of signal pads 236. Power pads 242 can alternate with ground pads 244 in the row. All the pads can be formed more closely by staggering the pads in the inner row with the signal pads in the outer row.

Typically, the input/output circuitry in the active layer of the die is configured along the die perimeter, near one or more of the edges. Confining all the pads to rows near the perimeter of the semiconductor die forming a pad ring which allows a reduction in the die cost by reducing the amount of on-die routing, and chip design tools can be employed in constructing the die.

Figure 9B:
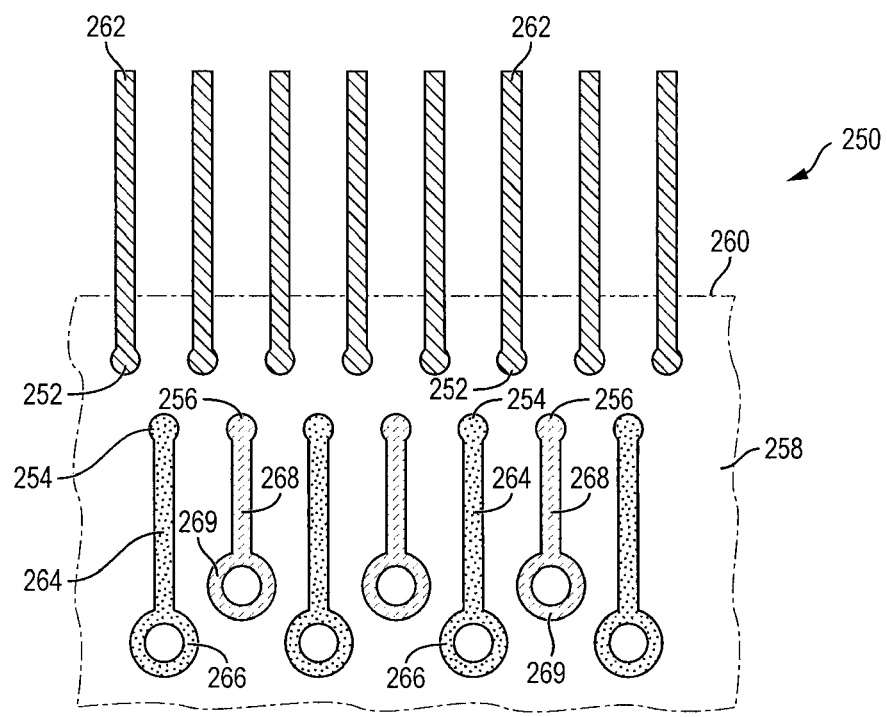

An arrangement of substrate pads corresponding to die pad layout 234 of FIG. 9a is shown in a plan view generally at 250 in FIG. 9b. Signal pads 252, power pads 254, and ground pads 256 are arranged on substrate surface 258 in an array complementary to die pad layout 234 of FIG. 9a, so that they can receive and be bonded respectively to the signal, power and ground bumps attached to the corresponding pads on semiconductor die 238. In this arrangement, all the pads 252 associated with signal routing are arranged in a row at the perimeter of the array, and escape routing for the signal pads on the perimeter of the array can directly cross beneath die edge 260 as traces 262 in the uppermost metal layer of the substrate. Ground pads 256 and power pads 254 on substrate 258, which are inboard of the signal pads near the perimeter of the array, are connected to deeper metal layers in the substrate by way of short traces and vias. In FIG. 9b, power pads 254 are connected by way of power stubs or jogs 264 through power vias 266 to power traces in a metal layer beneath. Ground pads 256 are connected by way of ground stubs or jogs 268 through ground vias 269 to power traces in a metal layer beneath.

In FIGS. 9a and 9b, a small number of ground pads and/or a small number of power pads can be situated in the outer row, nearer the die edge. In the substrate, ground pads and/or power pads can be arranged in a corresponding fashion. Configurations can have as many as 10%, more usually less than about 5%, still more usually 0% or less than about 2%, of ground and power pads in the outer row, but locating power or ground pads in the outside row results in a reduction in the signal pad escape density. The signal pad escape density can be maximized by minimizing the number of power or ground pads in the periphery of the pad. In some embodiments, there are no power pads or ground pads in the outside row. Similarly, a small number of signal pads can be situated among the power and ground pads inward from the periphery of the die, and in the substrate the signal pads can be arranged in a corresponding fashion. However, such arrangements may require employing a lower substrate layer, entailing the use of vias and increasing the signal path length.

As noted above, the signal pad escape density is maximized where the number of ground and/or power pads in the outer row are minimized and, accordingly, the escape density can be at a maximum where there are no ground pads or power pads in the outer row. However, a signal pad that serves a radio frequency (RF) signal can have a ground pad adjacent on one side, or can be flanked on two sides by a signal pad and a ground pad for electromagnetic shielding of the signal. Signal pad escape density can be traded off to a limited extent, and arranging power and/or ground pads on two or three sides of a signal pad near the periphery of the die can provide a useful compromise.

Figure 10A:
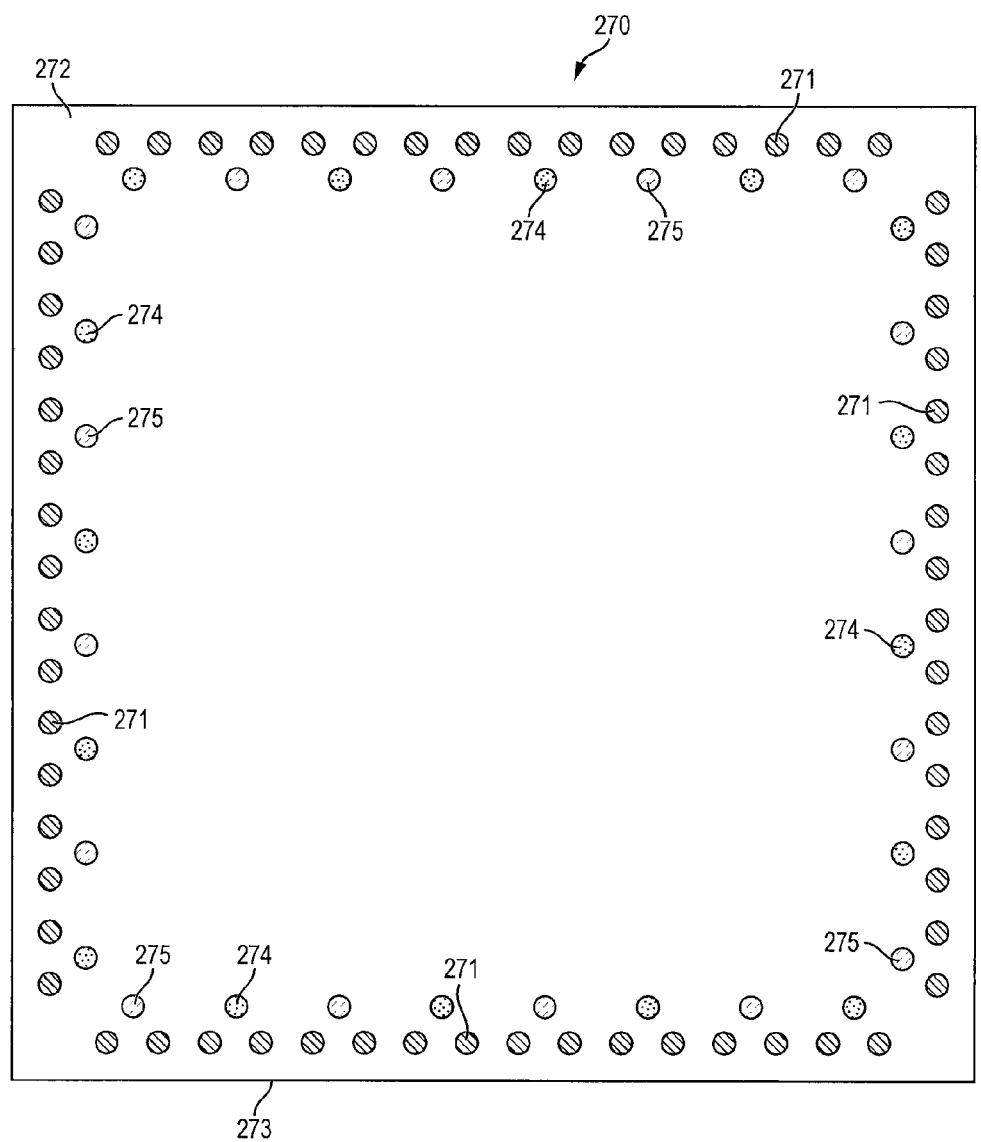
FIGS. 10a-10b illustrate a third pad layout on a die for a flipchip package.

In die pad layout 270 of FIG. 10a, signal pads 271 arranged on die surface 272 near the perimeter of the die, in a row parallel to die edges 273. Signal pads 271 are shown having about the same pitch as the pads in FIG. 5. Power pads 274 and ground pads 275 are arranged in a row, parallel to die edge 273 and inboard of the row of signal pads 271. Power pads 274 and grounds pads 275 have been depopulated. That is, there are about half as many power and ground pads as shown in FIG. 9a. Power pads 274 alternate with ground pads 275 in the row. All the pads can be formed more closely by staggering the pads in the inner row with the signal pads in the outer row.

Figure 10B:
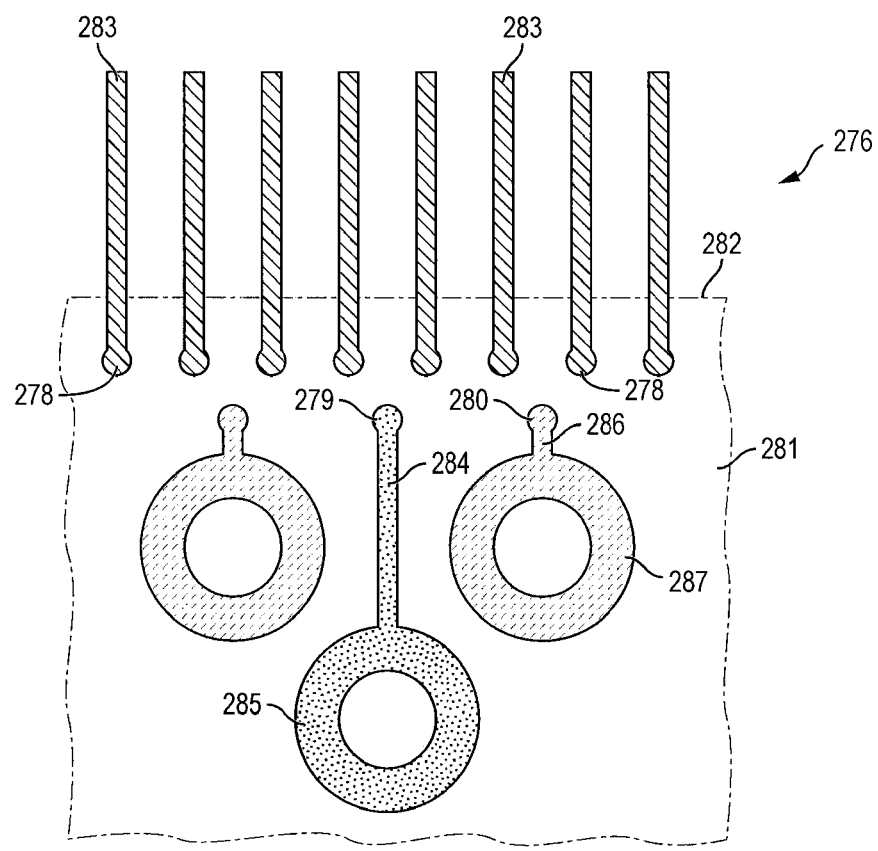

Depopulating the power and ground pads allows for a layout having much larger ground vias and power vias under the shadow of the semiconductor die, as illustrated in FIG. 10b, showing an arrangement of substrate pads in a plan view generally at 276 corresponding to die pad layout 270 of FIG. 10a. Signal pads 278, power pads 279, and ground pads 280 are arranged on substrate surface 281 in an array complementary to the die pad layout of FIG. 10a, so that they can receive and be bonded respectively to the signal, power and ground bumps attached to the corresponding pads on semiconductor die 272. In this arrangement, all the pads 278 associated with signal routing are arranged in a row at the perimeter of the array, and escape routing for the signal pads on the perimeter of the array can directly cross beneath die edge 282 as traces 283 in the uppermost metal layer of substrate 281. Ground pads 280 and power pads 279 on substrate 281, which are inboard of the signal pads near the perimeter of the array, are connected to deeper metal layers in the substrate by way of short traces and vias. Power pads 279 are connected by way of power stubs or jogs 284 through power vias 285 to power traces in a metal layer beneath. Ground pads 280 are connected by way of ground stubs or jogs 286 through ground vias 287 to power traces in a metal layer beneath.

The diameter of the ground and power vias is generally made about 2 to 3 times the line pitch. For greater power and ground via size, the alternating stubs can be of different lengths, so that the power and ground vias are arranged in a staggered array, as shown in FIG. 10b. For a signal line escape pitch of about 100 µm, an effective via pitch between the ground vias and power vias can be about 220 µm, and the via diameter can be as great as about 250 µm. Substrates having larger vias can be much less costly, and such a configuration can provide significant reductions in cost of the completed package.

Figure 11A:
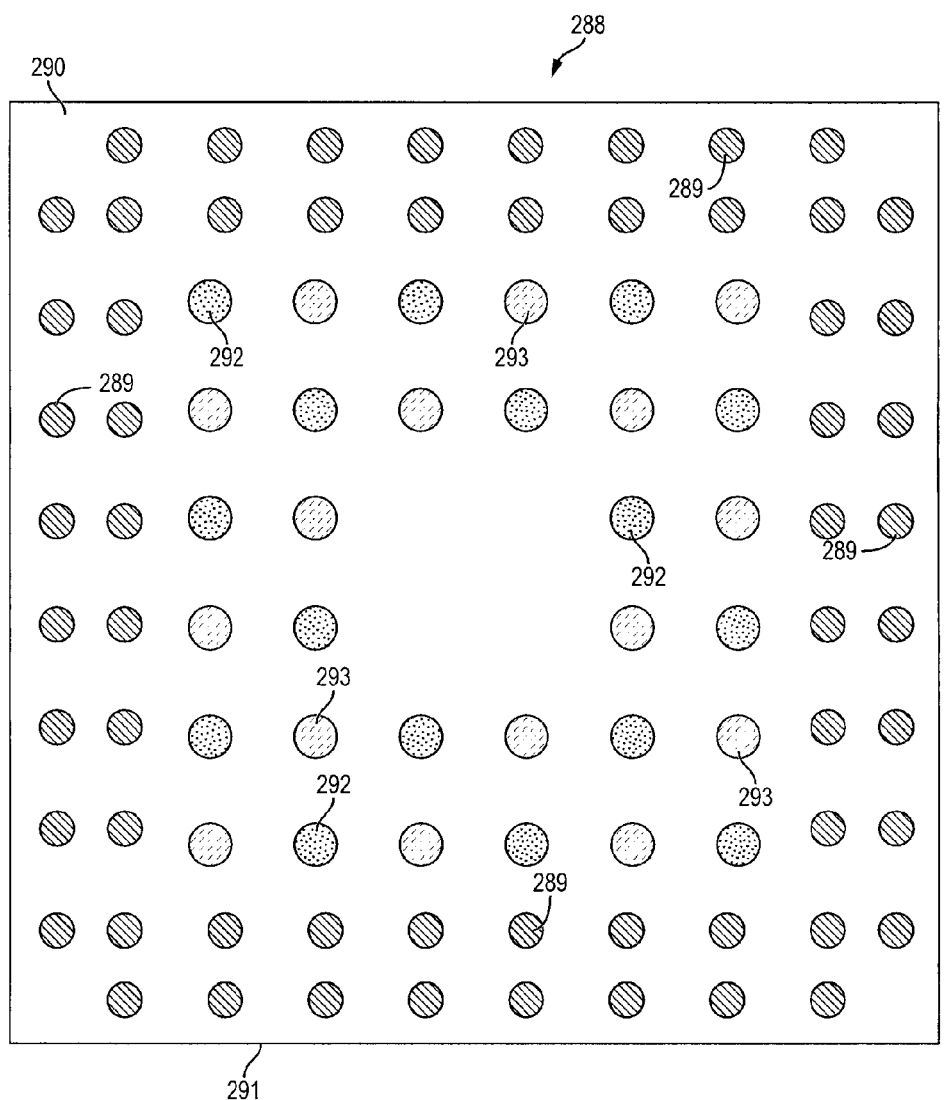
FIGS. 11a-11b illustrate a fourth pad layout on a die for a flipchip package.

In die pad layout 288 of FIG. 11a, signal pads 289 are arranged on die surface 290 near the perimeter of the semiconductor die, in a generally orthogonal array of two rows parallel to die edges 291. Signal pads 289 in each row are shown having about the same pitch as the pads in the outer row of FIG. 8a, and the inner and outer rows are spaced somewhat farther apart than are adjacent pads in a single row as in FIG. 5. That is, there are the same number of signal pads 289 in the orthogonal perimeter array of FIG. 11a as in the staggered perimeter array of FIG. 8a. In FIG. 11a, the orthogonal perimeter signal pitch array occupies slightly greater area than does the staggered perimeter signal pitch array of FIG. 8a; however, the pitch between nearest adjacent pads in the orthogonal array is less than the pitch between nearest adjacent pads in the staggered array so that the interconnect geometries, i.e. pad pitch and pad diameter, and corresponding interconnect bumps or balls, can be greater reducing manufacture costs. Power pads 292 and ground pads 293 are arranged in an array having a central area free of pads on an inboard area of the die surface, similar to FIGS. 5 and 8a.

Figure 11B:
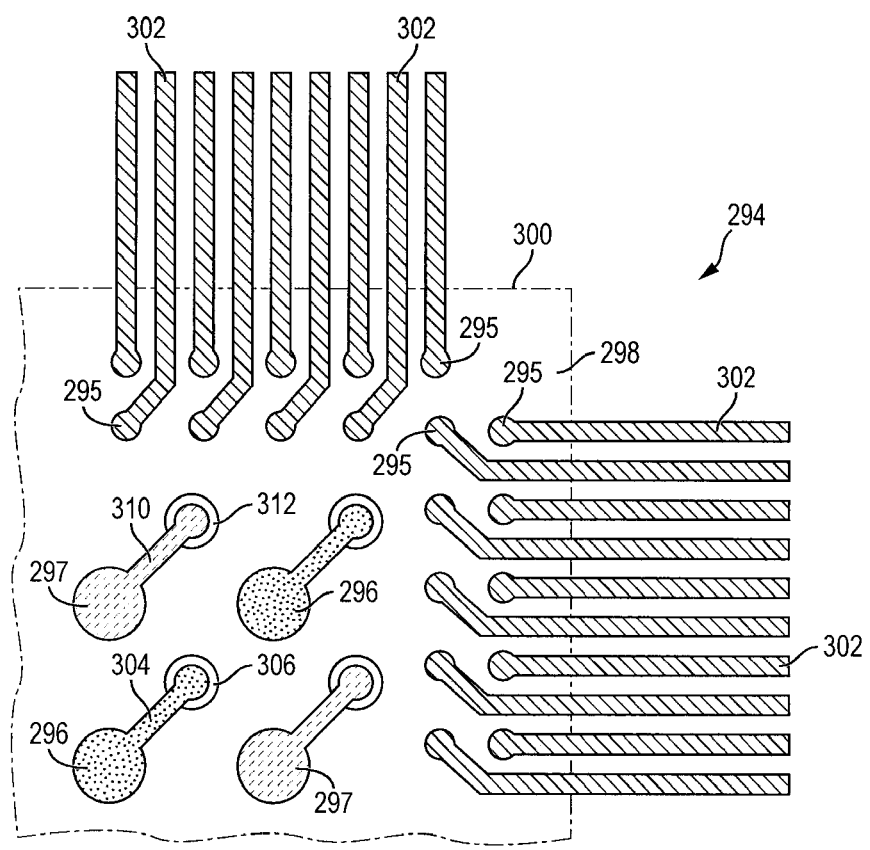

An arrangement of substrate pads corresponding to die pad layout 288 is shown in a plan view generally at 294 in FIG. 11b. Signal pads 295, power pads 296, and ground pads 297 are arranged on substrate surface 298 in an array complementary to die pad layout 288 of FIG. 11a so that they can receive and be bonded respectively to the signal, power and ground bumps attached to the corresponding pads on semiconductor die 290. In this arrangement, all the pads 295 associated with signal routing are arranged in an orthogonal array of two rows at the perimeter of the array, and escape routing for the signal pads on the perimeter of the array can directly cross beneath die edge 300 as traces 302 in the uppermost metal layer of the substrate. Signal pads 295 and power pads 296 on substrate 298, which are not at the perimeter of the array, are connected to deeper metal layers in the substrate by way of short traces and vias. Power pads 296 are connected by way of power stubs or jogs 304 through power vias 306 to power traces in a metal layer beneath. Ground pads 297 are connected by way of ground stubs or jogs 310 through ground vias 312 to power traces in a metal layer beneath.

The signal lines in the embodiments of FIGS. 8b, 9b, 10b, and 11b are routed from the signal pads, passing away from the die footprint, and all the power and ground lines are routed to vias beneath the die footprint. Signal traces can all be routed in a single upper metal layer on the substrate. Accordingly, no stubs or vias are required in the signal path, and parasitics in signal transmission are avoided. The signal traces can be made as close together as available techniques for trace formation allow. The signal pads can be made as close together as available techniques for trace formation and bump bonding allow.

The foregoing examples illustrate embodiments in which no ground or power interconnections are located among the signal interconnects nearest the perimeter of the die and die footprint on the substrate. No signal interconnects are located among the power and ground interconnections well within the core array about the middle of the die and die footprint. In some circumstances, one or a few signal interconnections can be located within the core array, usually adjacent to ground interconnects, and, accordingly, to route one or a few signal lines in the substrate to a via beneath the die footprint, to connect with a lower metal layer in the substrate or to route such signal lines in the upper metal layer of the substrate from well within the die footprint outward under the die edge. In some circumstances, one or a few power interconnections or, more usually, one or a few ground interconnections more peripherally, among the signal interconnections can be located near the perimeter of the die and, accordingly, near the perimeter of the die footprint on the substrate. Some circuit designs situate a clock signal interconnection nearer a ground interconnection.

All or substantially all the die signal pads are arranged in a row or in an array near the die perimeter. All or substantially all the die power and ground pads are located inboard from substantially all the die signal pads. Particularly, the advantages of segregating signal pads near the perimeter from ground and power pads in the core can be significantly degraded as the number or proportion of non-segregated pads increases. The proportion of signal pads that are not in a perimeter row or a perimeter array is usually less than about 10% of all signal pads, more usually less than about 5% of all signal pads, and still more usually 0% or in the range 0% to about 2% of all signal pads. The proportion of ground or power pads that are not inboard from the perimeter row or perimeter array of signal pads is usually less than about 10% of all power and ground pads, more usually less than about 5% of all power and ground pads, and still more usually 0% or in the range 0% to about 2% of all signal pads.

The signal pads are arranged in a row or in an array along the entire perimeter of the die, that is, along all four edges of the rectangular die. In some embodiments, the signal pads are arranged along fewer than all the die edges, and the advantages can be realized particularly in embodiments in which the signal pads are arranged in a peripheral row or a peripheral array along any two or more of the four die edges.

Flipchip packages can be made using substrates having few layers, and circuitry on the various layers can be effectively allocated according to function, reducing substrate cost as well as improving performance.

FIGS. 12-17 describe other embodiments with various interconnect structures which can be used in combination with the die pad layout, including signal pads, power pads, and ground pads, as described in FIGS. 5-11. More specifically, the semiconductor die contact pads and corresponding interconnect conductive traces can correspond to the signal pads, power pads, or ground pads in the die pad layout. FIG. 12a shows a semiconductor wafer 320 with a base substrate material 322, such as silicon, germanium, gallium arsenide, indium phosphide, or silicon carbide, for structural support. A plurality of semiconductor die or components 324 is formed on wafer 320 separated by saw streets 326 as described above.

Figure 12A:
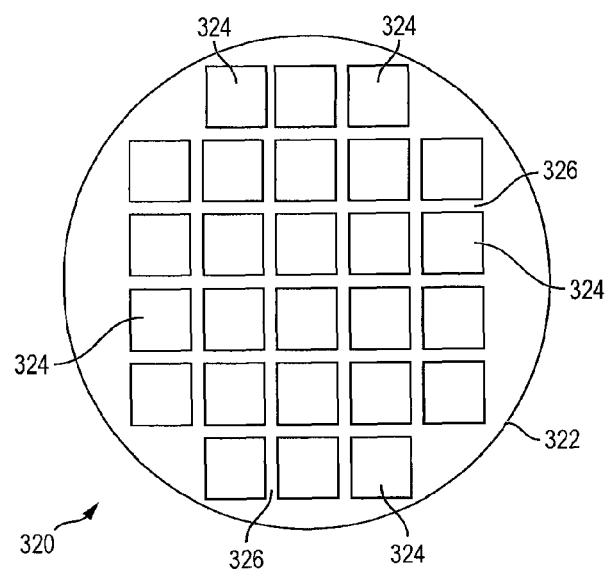
FIGS. 12a-12h illustrate various interconnect structures formed over a semiconductor die for bonding to conductive traces on a substrate.
Figure 12B:
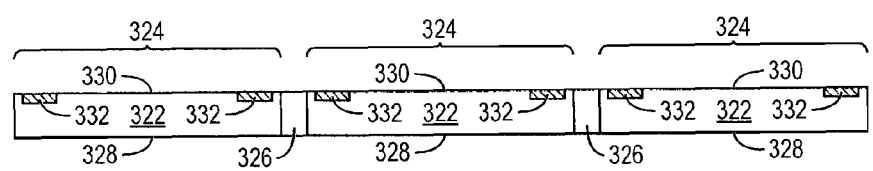

FIG. 12b shows a cross-sectional view of a portion of semiconductor wafer 320. Each semiconductor die 324 has a back surface 328 and active surface 330 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 330 to implement analog circuits or digital circuits, such as digital signal processor (DSP), ASIC, memory, or other signal processing circuit. Semiconductor die 324 can also contain integrated passive devices (IPDs), such as inductors, capacitors, and resistors, for RF signal processing. In one embodiment, semiconductor die 324 is a flipchip type semiconductor die.

An electrically conductive layer 332 is formed over active surface 330 using PVD, CVD, electrolytic plating, electroless plating process, or other suitable metal deposition process. Conductive layer 332 can be one or more layers of Al, Cu, Sn, Ni, Au, Ag, or other suitable electrically conductive material. Conductive layer 332 operates as contact pads electrically connected to the circuits on active surface 330.

Figure 12C:
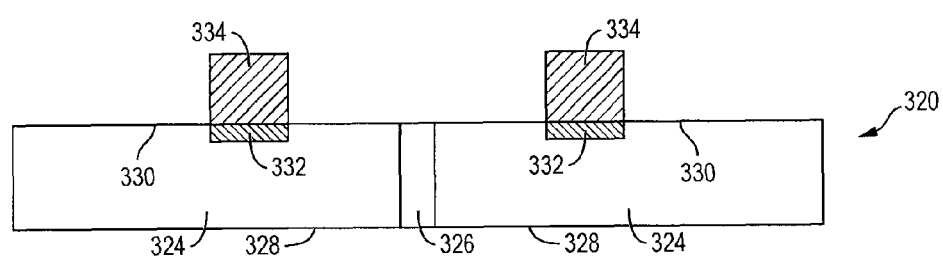
Figure 12D:
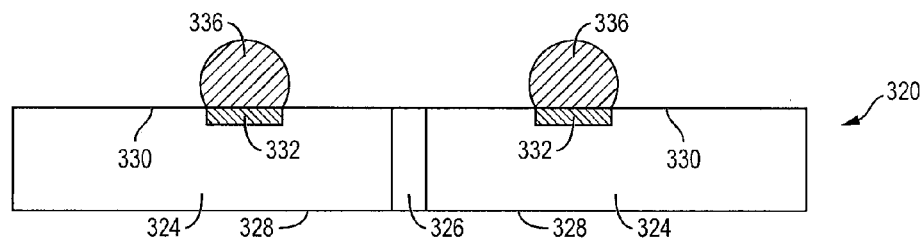

FIG. 12c shows a portion of semiconductor wafer 320 with an interconnect structure formed over contact pads 332. An electrically conductive bump material 334 is deposited over contact pads 332 using an evaporation, electrolytic plating, electroless plating, ball drop, or screen printing process. Bump material 334 can be Al, Sn, Ni, Au, Ag, Pb, Bi, Cu, solder, and combinations thereof, with an optional flux solution. For example, bump material 334 can be eutectic Sn/Pb, high-lead solder, or lead-free solder. Bump material 334 is generally compliant and undergoes plastic deformation greater than about 25 µm under a force equivalent to a vertical load of about 200 grams. Bump material 334 is bonded to contact pad 332 using a suitable attachment or bonding process. For example, bump material 334 can be compression bonded to contact pad 332. Bump material 334 can also be reflowed by heating the material above its melting point to form spherical balls or bumps 336, as shown in FIG. 12d. In some applications, bumps 336 are reflowed a second time to improve electrical connection to contact pad 332. Bumps 336 represent one type of interconnect structure that can be formed over contact pad 332. The interconnect structure can also use stud bump, micro bump, or other electrical interconnect.

Figure 12E:
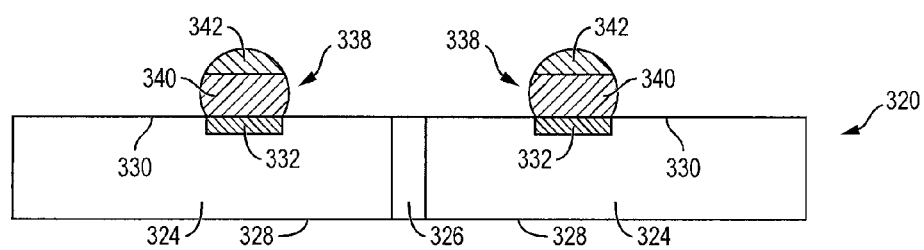

FIG. 12e shows another embodiment of the interconnect structure formed over contact pads 332 as composite bumps 338 including a non-fusible or non-collapsible portion 340 and fusible or collapsible portion 342. The fusible or collapsible and non-fusible or non-collapsible attributes are defined for bumps 338 with respect to reflow conditions. The non-fusible portion 340 can be Au, Cu, Ni, high-lead solder, or lead-tin alloy. The fusible portion 342 can be Sn, lead-free alloy, Sn—Ag alloy, Sn—Ag—Cu alloy, Sn—Ag-indium (In) alloy, eutectic solder, tin alloys with Ag, Cu, or Pb, or other relatively low temperature melt solder. In one embodiment, given a contact pad 332 width or diameter of 100 µm, the non-fusible portion 340 is about 45 µm in height and fusible portion 342 is about 35 µm in height.

Figure 12F:
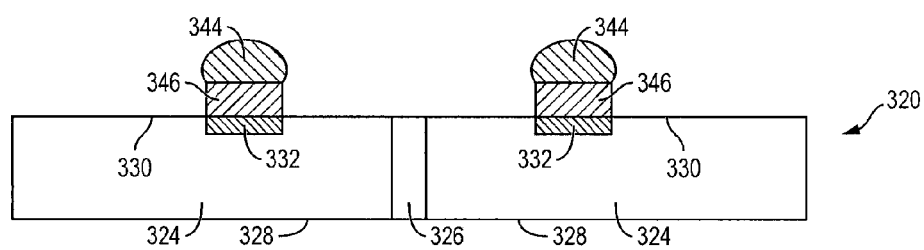

FIG. 12f shows another embodiment of the interconnect structure formed over contact pads 332 as bump 344 over conductive pillar 346. Bump 344 is fusible or collapsible and conductive pillar 346 is non-fusible or non-collapsible. The fusible or collapsible and non-fusible or non-collapsible attributes are defined with respect to reflow conditions. Bump 344 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. Conductive pillar 346 can be Au, Cu, Ni, high-lead solder, or lead-tin alloy. In one embodiment, conductive pillar 346 is a Cu pillar and bump 344 is a solder cap. Given a contact pad 332 width or diameter of 100 µm, conductive pillar 346 is about 45 µm in height and bump 344 is about 35 µm in height.

Figure 12G:
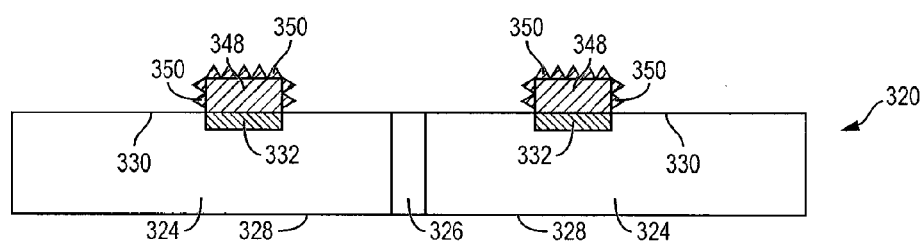

FIG. 12g shows another embodiment of the interconnect structure formed over contact pads 332 as bump material 348 with asperities 350. Bump material 348 is soft and deformable under reflow conditions with a low yield strength and high elongation to failure, similar to bump material 334. Asperities 350 are formed with a plated surface finish and are shown exaggerated in the figures for purposes of illustration. The scale of asperities 350 is generally in the order about 1-25 μm. The asperities can also be formed on bump 336, composite bump 338, and bump 344.

Figure 12H:
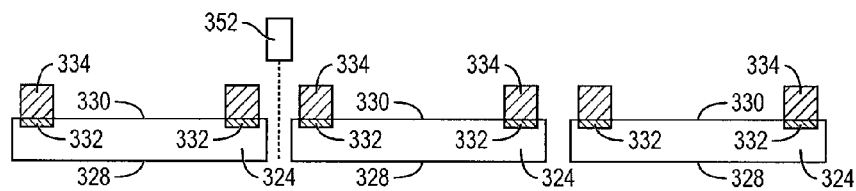

In FIG. 12h, semiconductor wafer 320 is singulated through saw street 326 using a saw blade or laser cutting tool 352 into individual semiconductor die 324.

Figure 13A:
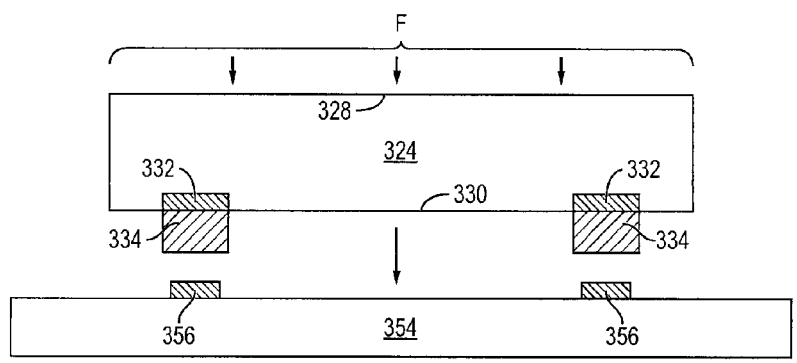
FIGS. 13a-13g illustrate the semiconductor die and interconnect structure bonded to the conductive traces.

FIG. 13a shows a substrate or PCB 354 with conductive trace 356. Substrate 354 can be a single-sided FR5 laminate or 2-sided BT-resin laminate. Semiconductor die 324 is positioned so that bump material 334 is aligned with an interconnect site on conductive trace 356, see FIGS. 21a-21g. Alternatively, bump material 334 can be aligned with a conductive pad or other interconnect site formed on substrate 354. Bump material 334 is wider than conductive trace 356. In one embodiment, bump material 334 has a width of less than 100 μm and conductive trace or pad 356 has a width of 35 μm for a bump pitch of 150 μm. Contact pads 332 and conductive traces 356 can correspond to the signal pads, power pads, or ground pads in the die pad layout of FIGS. 5-11.

Figure 13B:
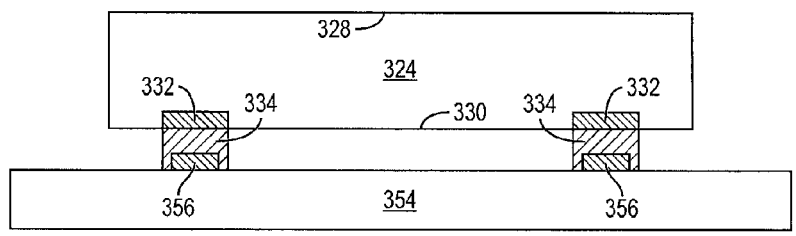

A pressure or force F is applied to back surface 328 of semiconductor die 324 to press bump material 334 onto conductive trace 356. The force F can be applied with an elevated temperature. Due to the compliant nature of bump material 334, the bump material deforms or extrudes around the top surface and side surfaces of conductive trace 356, referred to as bump-on-lead (BOL). In particular, the application of pressure causes bump material 334 to undergo a plastic deformation greater than about 25 μm under force F equivalent to a vertical load of about 200 grams and cover the top surface and side surfaces of the conductive trace, as shown in FIG. 13b. Bump material 334 can also be metallurgically connected to conductive trace 356 by bringing the bump material in physical contact with the conductive trace and then reflowing the bump material under a reflow temperature.

By making conductive trace 356 narrower than bump material 334, the conductive trace pitch can be reduced to increase routing density and I/O count. The narrower conductive trace 356 reduces the force F needed to deform bump material 334 around the conductive trace. For example, the requisite force F may be 30-50% of the force needed to deform bump material against a conductive trace or pad that is wider than the bump material. The lower compressive force F is useful for fine pitch interconnect and small die to maintain coplanarity with a specified tolerance and achieve uniform z-direction deformation and high reliability interconnect union. In addition, deforming bump material 334 around conductive trace 356 mechanically locks the bump to the trace to prevent die shifting or die floating during reflow.

Figure 13C:
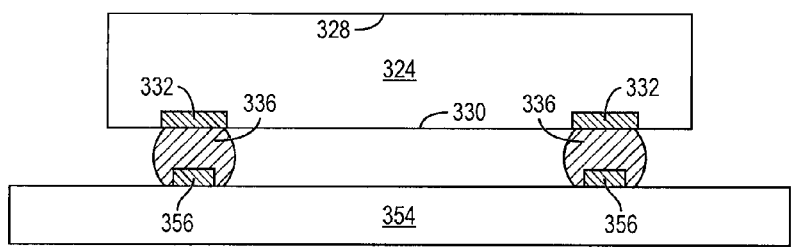

FIG. 13c shows bump 336 formed over contact pad 332 of semiconductor die 324. Semiconductor die 324 is positioned so that bump 336 is aligned with an interconnect site on conductive trace 356. Alternatively, bump 336 can be aligned with a conductive pad or other interconnect site formed on substrate 354. Bump 336 is wider than conductive trace 356. Contact pads 332 and conductive traces 356 can correspond to the signal pads, power pads, or ground pads in the die pad layout of FIGS. 5-11.

A pressure or force F is applied to back surface 328 of semiconductor die 324 to press bump 336 onto conductive trace 356. The force F can be applied with an elevated temperature. Due to the compliant nature of bump 336, the bump deforms or extrudes around the top surface and side surfaces of conductive trace 356. In particular, the application of pressure causes bump material 336 to undergo a plastic deformation and cover the top surface and side surfaces of conductive trace 356. Bump 336 can also be metallurgically connected to conductive trace 356 by bringing the bump in physical contact with the conductive trace under reflow temperature.

By making conductive trace 356 narrower than bump 336, the conductive trace pitch can be reduced to increase routing density and I/O count. The narrower conductive trace 356 reduces the force F needed to deform bump 336 around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming bump 336 around conductive trace 356 mechanically locks the bump to the trace to prevent die shifting or die floating during reflow.

Figure 13D:
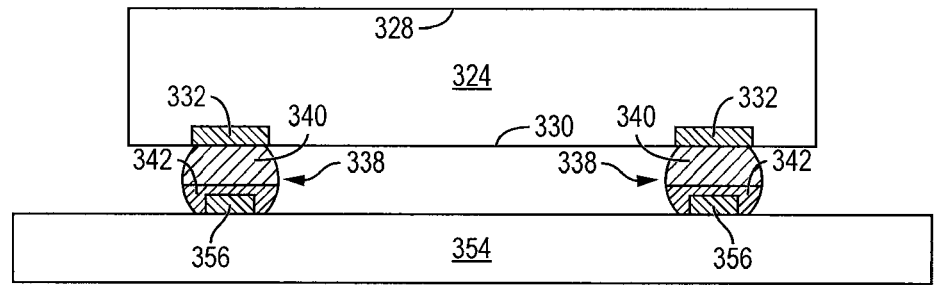

FIG. 13d shows composite bump 338 formed over contact pad 332 of semiconductor die 324. Semiconductor die 324 is positioned so that composite bump 338 is aligned with an interconnect site on conductive trace 356. Alternatively, composite bump 338 can be aligned with a conductive pad or other interconnect site formed on substrate 354. Composite bump 338 is wider than conductive trace 356. Contact pads 332 and conductive traces 356 can correspond to the signal pads, power pads, or ground pads in the die pad layout of FIGS. 5-11.

A pressure or force F is applied to back surface 328 of semiconductor die 324 to press fusible portion 342 onto conductive trace 356. The force F can be applied with an elevated temperature. Due to the compliant nature of fusible portion 342, the fusible portion deforms or extrudes around the top surface and side surfaces of conductive trace 356. In particular, the application of pressure causes fusible portion 342 to undergo a plastic deformation and cover the top surface and side surfaces of conductive trace 356. Composite bump 338 can also be metallurgically connected to conductive trace 356 by bringing fusible portion 342 in physical contact with the conductive trace under reflow temperature. The non-fusible portion 340 does not melt or deform during the application of pressure or temperature and retains its height and shape as a vertical standoff between semiconductor die 324 and substrate 354. The additional displacement between semiconductor die 324 and substrate 354 provides greater coplanarity tolerance between the mating surfaces.

During a reflow process, a large number (e.g., thousands) of composite bumps 338 on semiconductor die 324 are attached to interconnect sites on conductive trace 356 of substrate 354. Some of the bumps 338 may fail to properly connect to conductive trace 356, particularly if die 324 is warped. Recall that composite bump 338 is wider than conductive trace 356. With a proper force applied, the fusible portion 342 deforms or extrudes around the top surface and side surfaces of conductive trace 356 and mechanically locks composite bump 338 to the conductive trace. The mechanical interlock is formed by nature of the fusible portion 342 being softer and more compliant than conductive trace 356 and therefore deforming over the top surface and around the side surfaces of the conductive trace for greater contact surface area. The mechanical interlock between composite bump 338 and conductive trace 356 holds the bump to the conductive trace during reflow, i.e., the bump and conductive trace do not lose contact. Accordingly, composite bump 338 mating to conductive trace 356 reduces bump interconnect failures.

Figure 13E:
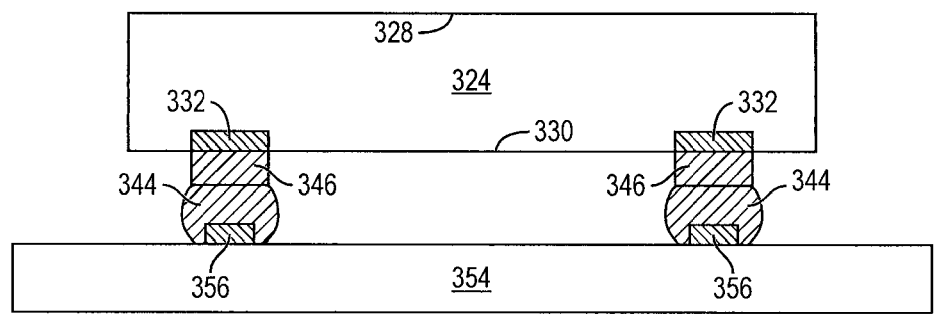

FIG. 13e shows conductive pillar 346 and bump 344 formed over contact pad 332 of semiconductor die 324. Semiconductor die 324 is positioned so that bump 344 is aligned with an interconnect site on conductive trace 356. Alternatively, bump 344 can be aligned with a conductive pad or other interconnect site formed on substrate 354. Bump 344 is wider than conductive trace 356. Contact pads 332 and conductive traces 356 can correspond to the signal pads, power pads, or ground pads in the die pad layout of FIGS. 5-11.

A pressure or force F is applied to back surface 328 of semiconductor die 324 to press bump 344 onto conductive trace 356. The force F can be applied with an elevated temperature. Due to the compliant nature of bump 344, the bump deforms or extrudes around the top surface and side surfaces of conductive trace 356. In particular, the application of pressure causes bump 344 to undergo a plastic deformation and cover the top surface and side surfaces of conductive trace 356. Conductive pillar 346 and bump 344 can also be metallurgically connected to conductive trace 356 by bringing the bump in physical contact with the conductive trace under reflow temperature. Conductive pillar 346 does not melt or deform during the application of pressure or temperature and retains its height and shape as a vertical standoff between semiconductor die 324 and substrate 354. The additional displacement between semiconductor die 324 and substrate 354 provides greater coplanarity tolerance between the mating surfaces. The wider bump 344 and narrower conductive trace 356 have similar low requisite compressive force and mechanical locking features and advantages described above for bump material 334 and bump 336.

Figure 13F:
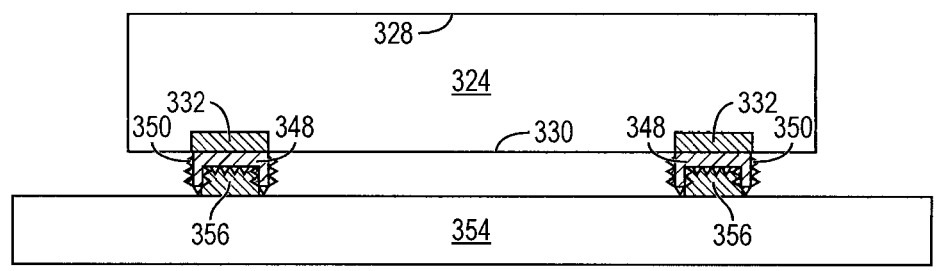

FIG. 13f shows bump material 348 with asperities 350 formed over contact pad 332 of semiconductor die 324. Semiconductor die 324 is positioned so that bump material 348 is aligned with an interconnect site on conductive trace 356. Alternatively, bump material 348 can be aligned with a conductive pad or other interconnect site formed on substrate 354. Bump material 348 is wider than conductive trace 356. A pressure or force F is applied to back surface 328 of semiconductor die 324 to press bump material 348 onto conductive trace 356. The force F can be applied with an elevated temperature. Due to the compliant nature of bump material 348, the bump deforms or extrudes around the top surface and side surfaces of conductive trace 356. In particular, the application of pressure causes bump material 348 to undergo a plastic deformation and cover the top surface and side surfaces of conductive trace 356. In addition, asperities 350 are metallurgically connected to conductive trace 356. Asperities 350 are sized on the order about 1-25 μm.

Figure 13G:
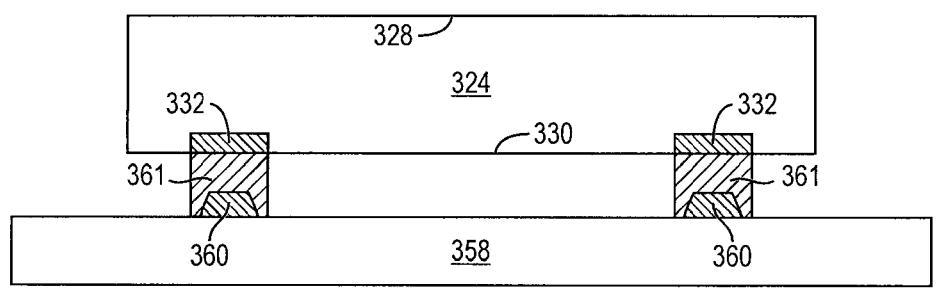

FIG. 13g shows a substrate or PCB 358 with trapezoidal conductive trace 360 having angled or sloped sides. Bump material 361 is formed over contact pad 332 of semiconductor die 324. Semiconductor die 324 is positioned so that bump material 361 is aligned with an interconnect site on conductive trace 360. Alternatively, bump material 361 can be aligned with a conductive pad or other interconnect site formed on substrate 358. Bump material 361 is wider than conductive trace 360. Contact pads 332 and conductive traces 360 can correspond to the signal pads, power pads, or ground pads in the die pad layout of FIGS. 5-11.

A pressure or force F is applied to back surface 328 of semiconductor die 324 to press bump material 361 onto conductive trace 360. The force F can be applied with an elevated temperature. Due to the compliant nature of bump material 361, the bump material deforms or extrudes around the top surface and side surfaces of conductive trace 360. In particular, the application of pressure causes bump material 361 to undergo a plastic deformation under force F to cover the top surface and the angled side surfaces of conductive trace 360. Bump material 361 can also be metallurgically connected to conductive trace 360 by bringing the bump material in physical contact with the conductive trace and then reflowing the bump material under a reflow temperature.

FIGS. 14a-14d show a BOL embodiment of semiconductor die 324 and elongated composite bump 362 having a non-fusible or non-collapsible portion 364 and fusible or collapsible portion 366. The non-fusible portion 364 can be Au, Cu, Ni, high-lead solder, or lead-tin alloy. The fusible portion 366 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. The non-fusible portion 364 makes up a larger part of composite bump 362 than the fusible portion 366. The non-fusible portion 364 is fixed to contact pad 332 of semiconductor die 324.

Figure 14A:
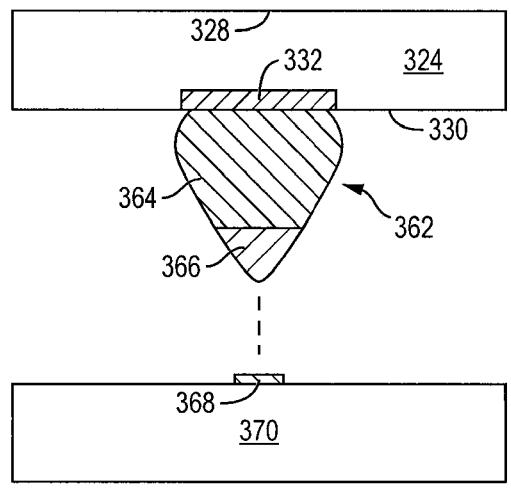
FIGS. 14a-14d illustrate the semiconductor die with a wedge-shaped interconnect structure bonded to the conductive traces.
Figure 14B:
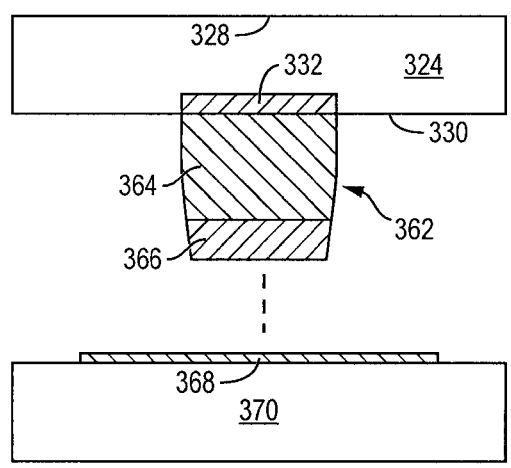
Figure 14C:
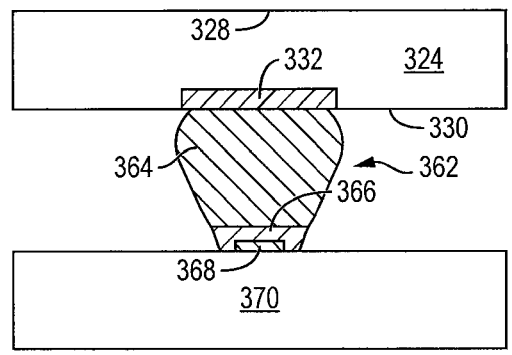
Figure 14D:
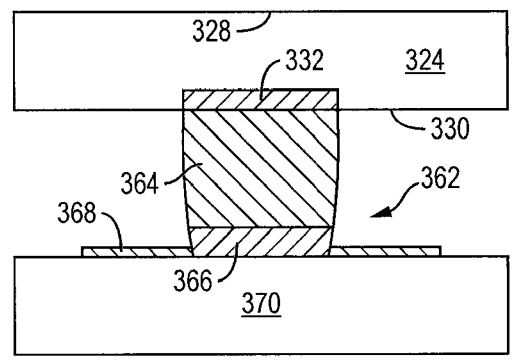

Semiconductor die 324 is positioned so that composite bump 362 is aligned with an interconnect site on conductive trace 368 formed on substrate 370, as shown in FIG. 14a. Composite bump 362 is tapered along conductive trace 368, i.e., the composite bump has a wedge shape, longer along a length of conductive trace 368 and narrower across the conductive trace. The tapered aspect of composite bump 362 occurs along the length of conductive trace 368. The view in FIG. 14a shows the shorter aspect or narrowing taper co-linear with conductive trace 368. The view in FIG. 14b, normal to FIG. 14a, shows the longer aspect of the wedge-shaped composite bump 362. The shorter aspect of composite bump 362 is wider than conductive trace 368. The fusible portion 366 collapses around conductive trace 368 upon application of pressure and/or reflow with heat, as shown in FIGS. 14c and 14d. The non-fusible portion 364 does not melt or deform during reflow and retains its form and shape. The non-fusible portion 364 can be dimensioned to provide a standoff distance between semiconductor die 324 and substrate 370. A finish such as Cu OSP can be applied to substrate 370. Contact pads 332 and conductive traces 368 can correspond to the signal pads, power pads, or ground pads in the die pad layout of FIGS. 5-11.

During a reflow process, a large number (e.g., thousands) of composite bumps 362 on semiconductor die 324 are attached to interconnect sites on conductive trace 368 of substrate 370. Some of the bumps 362 may fail to properly connect to conductive trace 368, particularly if semiconductor die 324 is warped. Recall that composite bump 362 is wider than conductive trace 368. With a proper force applied, the fusible portion 366 deforms or extrudes around the top surface and side surfaces of conductive trace 368 and mechanically locks composite bump 362 to the conductive trace. The mechanical interlock is formed by nature of the fusible portion 366 being softer and more compliant than conductive trace 368 and therefore deforming around the top surface and side surfaces of the conductive trace for greater contact area. The wedge-shape of composite bump 362 increases contact area between the bump and conductive trace, e.g., along the longer aspect of FIGS. 14b and 14d, without sacrificing pitch along the shorter aspect of FIGS. 14a and 14c. The mechanical interlock between composite bump 362 and conductive trace 368 holds the bump to the conductive trace during reflow, i.e., the bump and conductive trace do not lose contact. Accordingly, composite bump 362 mating to conductive trace 368 reduces bump interconnect failures.

Figure 15A:
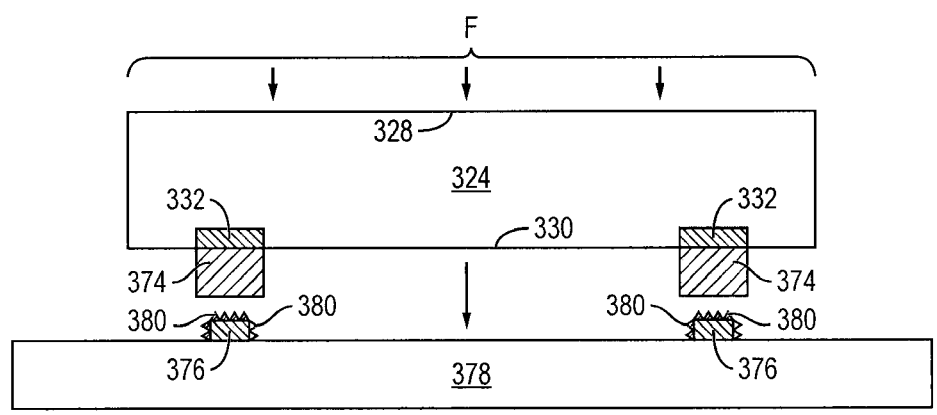
FIGS. 15a-15d illustrate another embodiment of the semiconductor die and interconnect structure bonded to the conductive traces.

FIGS. 15a-15d show a BOL embodiment of semiconductor die 324 with bump material 374 formed over contact pads 332, similar to FIG. 12c. In FIG. 15a, bump material 374 is generally compliant and undergoes plastic deformation greater than about 25 μm under a force equivalent to a vertical load of about 200 grams. Bump material 374 is wider than conductive trace 376 on substrate 378. A plurality of asperities 380 is formed on conductive trace 376 with a height on the order about 1-25 μm.

Figure 15B:
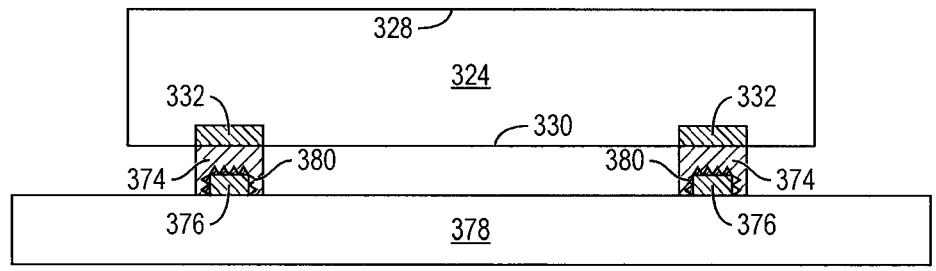

Semiconductor die 324 is positioned so that bump material 374 is aligned with an interconnect site on conductive trace 376. Alternatively, bump material 374 can be aligned with a conductive pad or other interconnect site formed on substrate 378. A pressure or force F is applied to back surface 328 of semiconductor die 324 to press bump material 374 onto conductive trace 376 and asperities 380, as shown in FIG. 15b. The force F can be applied with an elevated temperature. Due to the compliant nature of bump material 374, the bump material deforms or extrudes around the top surface and side surfaces of conductive trace 376 and asperities 380. In particular, the application of pressure causes bump material 374 to undergo a plastic deformation and cover the top surface and side surfaces of conductive trace 376 and asperities 380. The plastic flow of bump material 374 creates macroscopic mechanical interlocking points between the bump material and the top surface and side surfaces of conductive trace 376 and asperities 380. The plastic flow of bump material 374 occurs around the top surface and side surfaces of conductive trace 376 and asperities 380, but does not extend excessively onto substrate 378, which could cause electrical shorting and other defects. The mechanical interlock between the bump material and the top surface and side surfaces of conductive trace 376 and asperities 380 provides a robust connection with greater contact area between the respective surfaces, without significantly increasing the bonding force. The mechanical interlock between the bump material and the top surface and side surfaces of conductive trace 376 and asperities 380 also reduces lateral die shifting during subsequent manufacturing processes, such as encapsulation. Contact pads 332 and conductive traces 376 can correspond to the signal pads, power pads, or ground pads in the die pad layout of FIGS. 5-11.

Figure 15C:
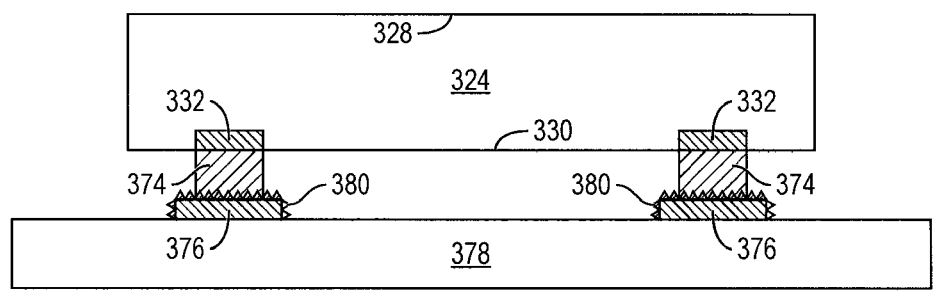

FIG. 15c shows another BOL embodiment with bump material 374 narrower than conductive trace 376. A pressure or force F is applied to back surface 328 of semiconductor die 324 to press bump material 374 onto conductive trace 376 and asperities 380. The force F can be applied with an elevated temperature. Due to the compliant nature of bump material 374, the bump material deforms or extrudes over the top surface of conductive trace 376 and asperities 380. In particular, the application of pressure causes bump material 374 to undergo a plastic deformation and cover the top surface of conductive trace 376 and asperities 380. The plastic flow of bump material 374 creates macroscopic mechanical interlocking points between the bump material and the top surface of conductive trace 376 and asperities 380. The mechanical interlock between the bump material and the top surface of conductive trace 376 and asperities 380 provides a robust connection with greater contact area between the respective surfaces, without significantly increasing the bonding force. The mechanical interlock between the bump material and the top surface of conductive trace 376 and asperities 380 also reduces lateral die shifting during subsequent manufacturing processes, such as encapsulation.

Figure 15D:
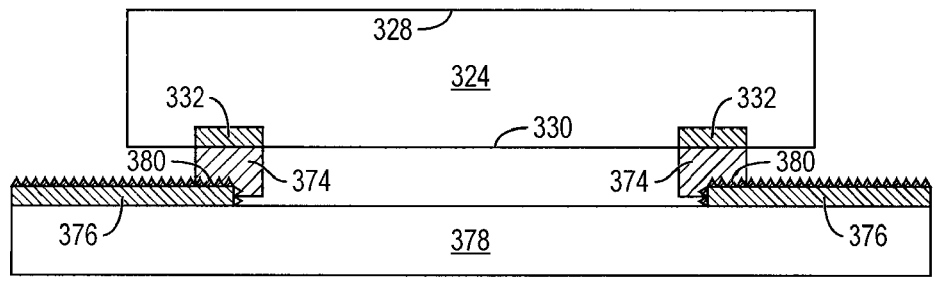

FIG. 15d shows another BOL embodiment with bump material 374 formed over an edge of conductive trace 376, i.e., part of the bump material is over the conductive trace and part of the bump material is not over the conductive trace. A pressure or force F is applied to back surface 328 of semiconductor die 324 to press bump material 374 onto conductive trace 376 and asperities 380. The force F can be applied with an elevated temperature. Due to the compliant nature of bump material 374, the bump material deforms or extrudes over the top surface and side surfaces of conductive trace 376 and asperities 380. In particular, the application of pressure causes bump material 374 to undergo a plastic deformation and cover the top surface and side surfaces of conductive trace 376 and asperities 380. The plastic flow of bump material 374 creates macroscopic mechanical interlocking between the bump material and the top surface and side surfaces of conductive trace 376 and asperities 380. The mechanical interlock between the bump material and the top surface and side surfaces of conductive trace 376 and asperities 380 provides a robust connection with greater contact area between the respective surfaces, without significantly increasing the bonding force. The mechanical interlock between the bump material and the top surface and side surfaces of conductive trace 376 and asperities 380 also reduces lateral die shifting during subsequent manufacturing processes, such as encapsulation.

Figure 16A:
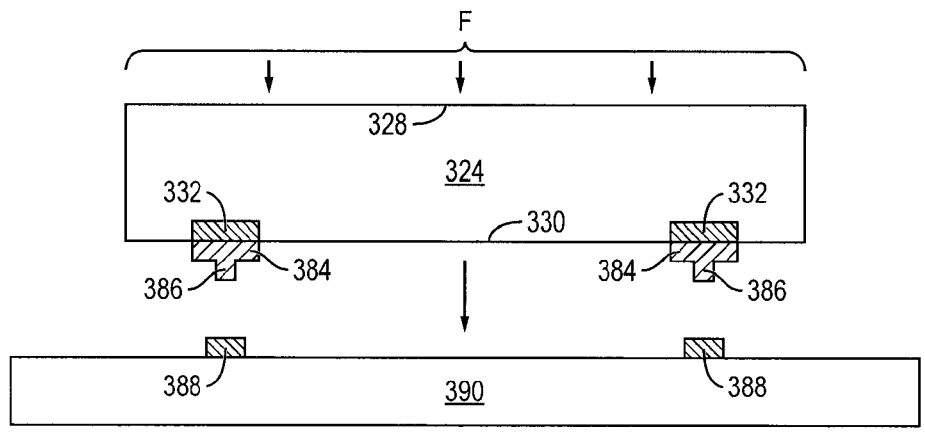
FIGS. 16a-16c illustrate stepped bump and stud bump interconnect structures bonded to the conductive traces.
Figure 16B:
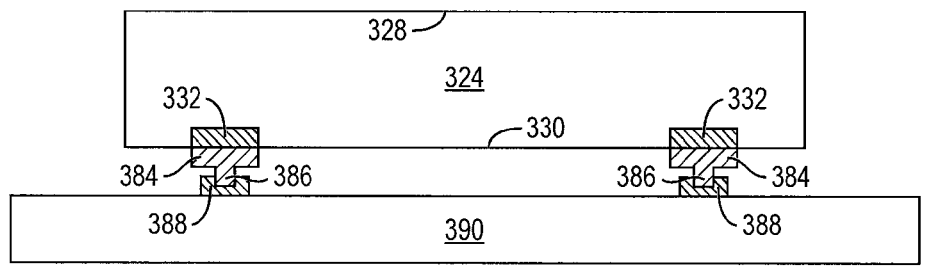
Figure 16C:
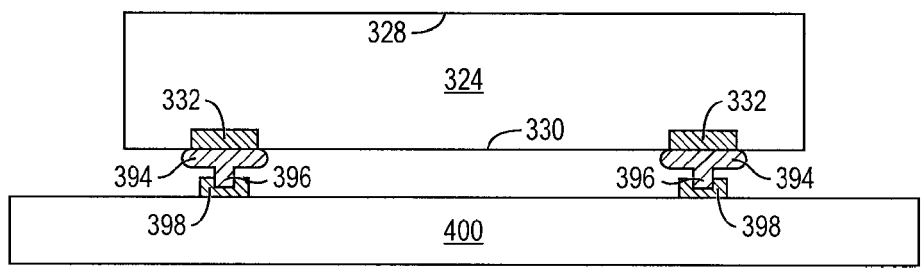

FIGS. 16a-16c show a BOL embodiment of semiconductor die 324 with bump material 384 formed over contact pads 332, similar to FIG. 12c. A tip 386 extends from the body of bump material 384 as a stepped bump with tip 386 narrower than the body of bump material 384, as shown in FIG. 16a. Semiconductor die 324 is positioned so that bump material 384 is aligned with an interconnect site on conductive trace 388 on substrate 390. More specifically, tip 386 is centered over an interconnect site on conductive trace 388. Alternatively, bump material 384 and tip 386 can be aligned with a conductive pad or other interconnect site formed on substrate 390. Bump material 384 is wider than conductive trace 388 on substrate 390.

Conductive trace 388 is generally compliant and undergoes plastic deformation greater than about 25 μm under a force equivalent to a vertical load of about 200 grams. A pressure or force F is applied to back surface 328 of semiconductor die 324 to press tip 384 onto conductive trace 388. The force F can be applied with an elevated temperature. Due to the compliant nature of conductive trace 388, the conductive trace deforms around tip 386, as shown in FIG. 16b. In particular, the application of pressure causes conductive trace 388 to undergo a plastic deformation and cover the top surface and side surfaces of tip 386. Contact pads 332 and conductive traces 388 can correspond to the signal pads, power pads, or ground pads in the die pad layout of FIGS. 5-11.

FIG. 16c shows another BOL embodiment with rounded bump material 394 formed over contact pads 332. A tip 396 extends from the body of bump material 394 to form a stud bump with the tip narrower than the body of bump material 394. Semiconductor die 324 is positioned so that bump material 394 is aligned with an interconnect site on conductive trace 398 on substrate 400. More specifically, tip 396 is centered over an interconnect site on conductive trace 398. Alternatively, bump material 394 and tip 396 can be aligned with a conductive pad or other interconnect site formed on substrate 400. Bump material 394 is wider than conductive trace 398 on substrate 400.

Conductive trace 398 is generally compliant and undergoes plastic deformation greater than about 25 μm under a force equivalent to a vertical load of about 200 grams. A pressure or force F is applied to back surface 328 of semiconductor die 324 to press tip 396 onto conductive trace 398. The force F can be applied with an elevated temperature. Due to the compliant nature of conductive trace 398, the conductive trace deforms around tip 396. In particular, the application of pressure causes conductive trace 398 to undergo a plastic deformation and cover the top surface and side surfaces of tip 396. Contact pads 332 and conductive traces 398 can correspond to the signal pads, power pads, or ground pads in the die pad layout of FIGS. 5-11.

The conductive traces described in FIGS. 13a-13g, 14a-14d, and 15a-15d can also be compliant material as described in FIGS. 16a-16c.

Figure 17A:
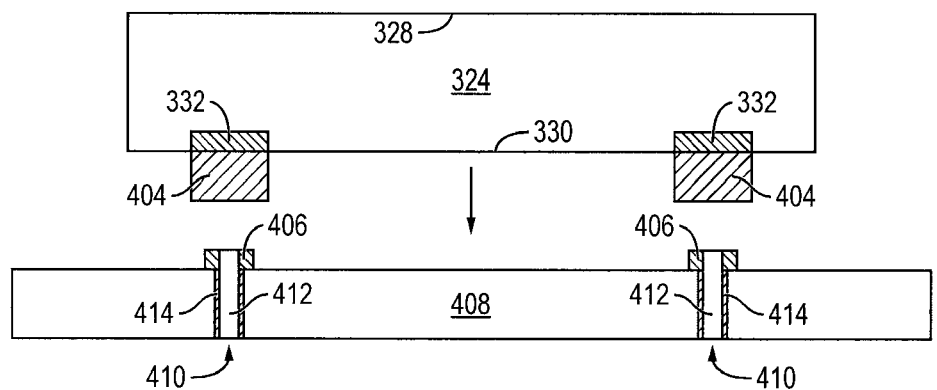
FIGS. 17a-17b illustrate conductive traces with conductive vias.
Figure 17B:
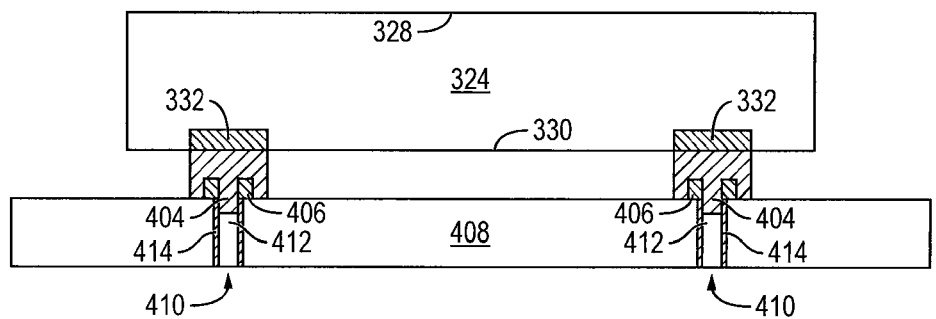

FIGS. 17a-17b show a BOL embodiment of semiconductor die 324 with bump material 404 formed over contact pads 332, similar to FIG. 11c. Bump material 404 is generally compliant and undergoes plastic deformation greater than about 25 µm under a force equivalent to a vertical load of about 200 grams. Bump material 404 is wider than conductive trace 406 on substrate 408. A conductive via 410 is formed through conductive trace 406 with an opening 412 and conductive sidewalls 414, as shown in FIG. 17a. Contact pads 332 and conductive traces 406 can correspond to the signal pads, power pads, or ground pads in the die pad layout of FIGS. 5-11.

Figure 21A:
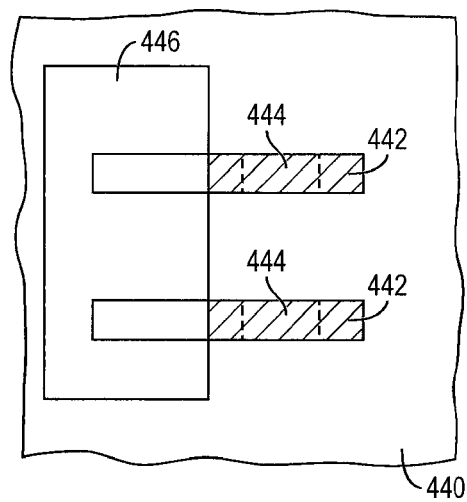
FIGS. 21a-21g illustrate various arrangements of the conductive traces with open solder registration.
Figure 21B:
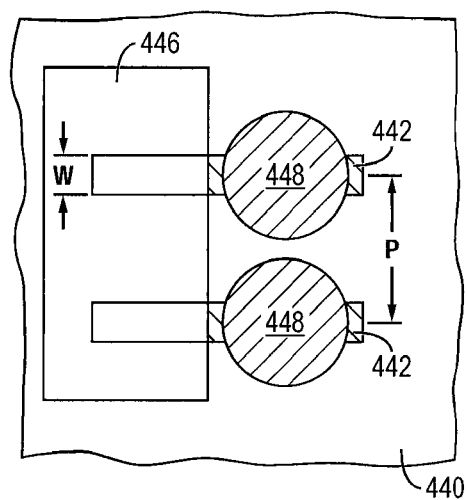
Figure 21C:
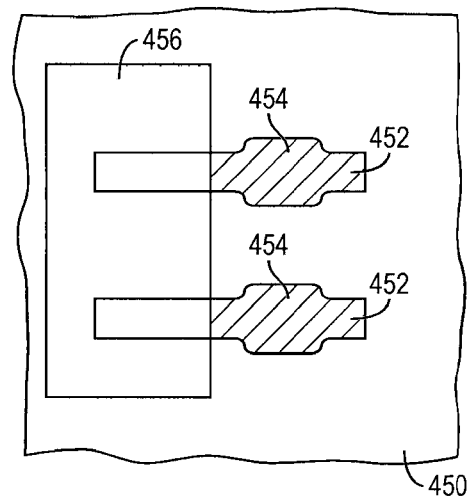
Figure 21D:
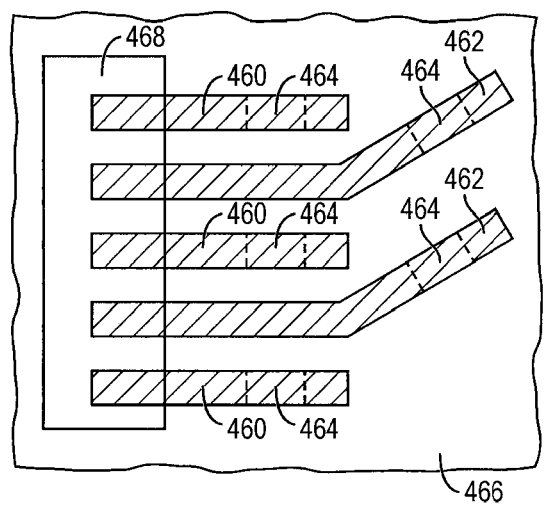
Figure 21E:
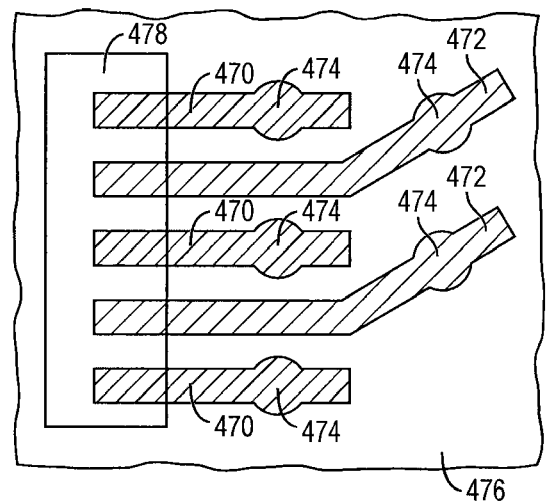
Figure 21F:
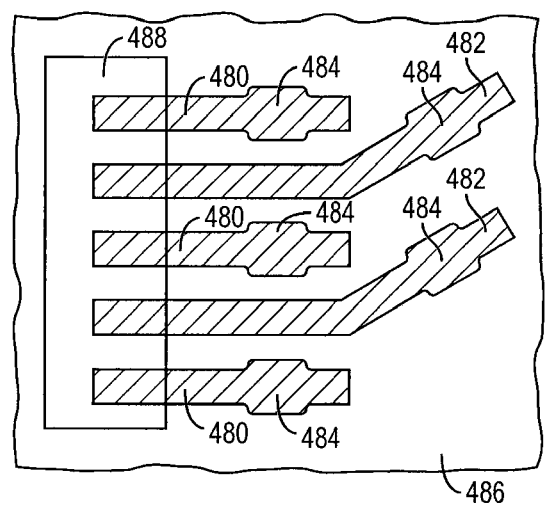
Figure 21G:
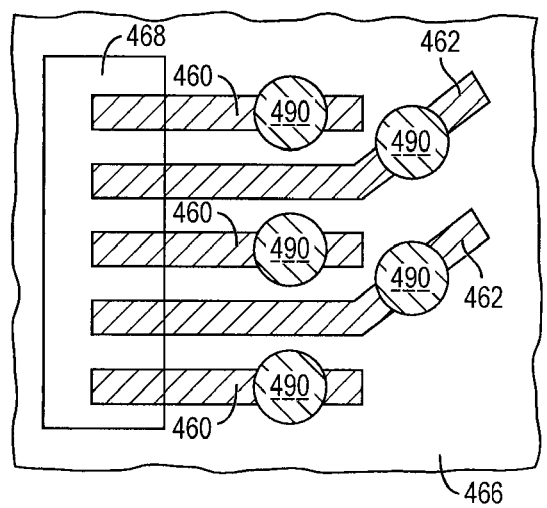

Semiconductor die 324 is positioned so that bump material 404 is aligned with an interconnect site on conductive trace 406, see FIGS. 21-21g. Alternatively, bump material 404 can be aligned with a conductive pad or other interconnect site formed on substrate 408. A pressure or force F is applied to back surface 328 of semiconductor die 324 to press bump material 404 onto conductive trace 406 and into opening 412 of conductive via 410. The force F can be applied with an elevated temperature. Due to the compliant nature of bump material 404, the bump material deforms or extrudes around the top surface and side surfaces of conductive trace 406 and into opening 412 of conductive vias 410, as shown in FIG. 17b. In particular, the application of pressure causes bump material 404 to undergo a plastic deformation and cover the top surface and side surfaces of conductive trace 406 and into opening 412 of conductive via 410. Bump material 404 is thus electrically connected to conductive trace 406 and conductive sidewalls 414 for z-direction vertical interconnect through substrate 408. The plastic flow of bump material 404 creates a mechanical interlock between the bump material and the top surface and side surfaces of conductive trace 406 and opening 412 of conductive via 410. The mechanical interlock between the bump material and the top surface and side surfaces of conductive trace 406 and opening 412 of conductive via 410 provides a robust connection with greater contact area between the respective surfaces, without significantly increasing the bonding force. The mechanical interlock between the bump material and the top surface and side surfaces of conductive trace 406 and opening 412 of conductive via 410 also reduces lateral die shifting during subsequent manufacturing processes, such as encapsulation. Since conductive via 410 is formed within the interconnect site with bump material 404, the total substrate interconnect area is reduced.

In the BOL embodiments of FIGS. 13a-13g, 14a-14d, 15a-15d, 16a-16c, and 17a-17b, by making the conductive trace narrower than the interconnect structure, the conductive trace pitch can be reduced to increase routing density and I/O count. The narrower conductive trace reduces the force F needed to deform the interconnect structure around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming the interconnect structure around the conductive trace mechanically locks the bump to the trace to prevent die shifting or die floating during reflow.

Figure 18A:
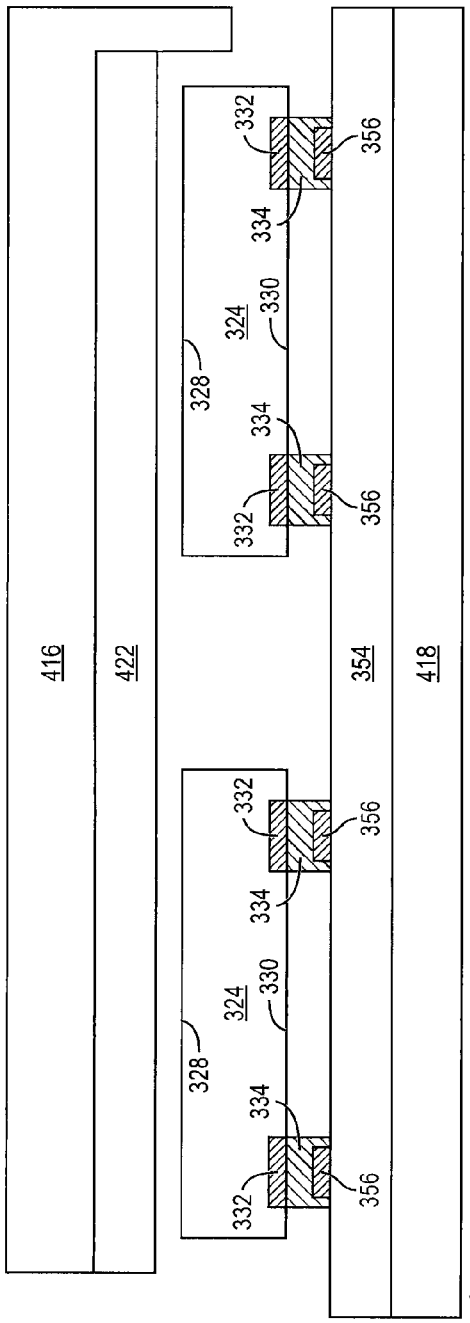
FIGS. 18a-18c illustrate mold underfill between the semiconductor die and substrate.
Figure 18B:
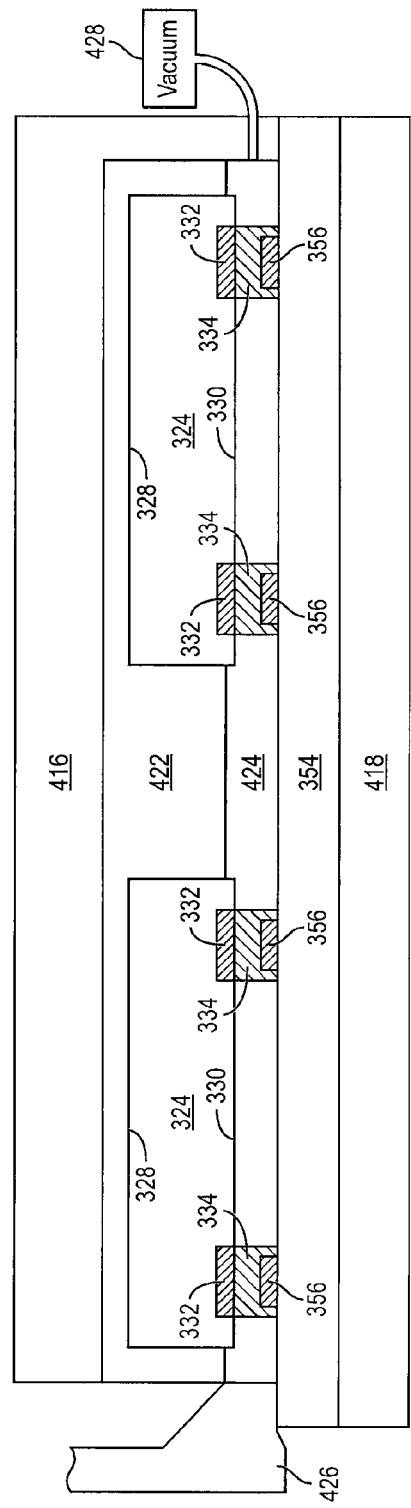
Figure 18C:
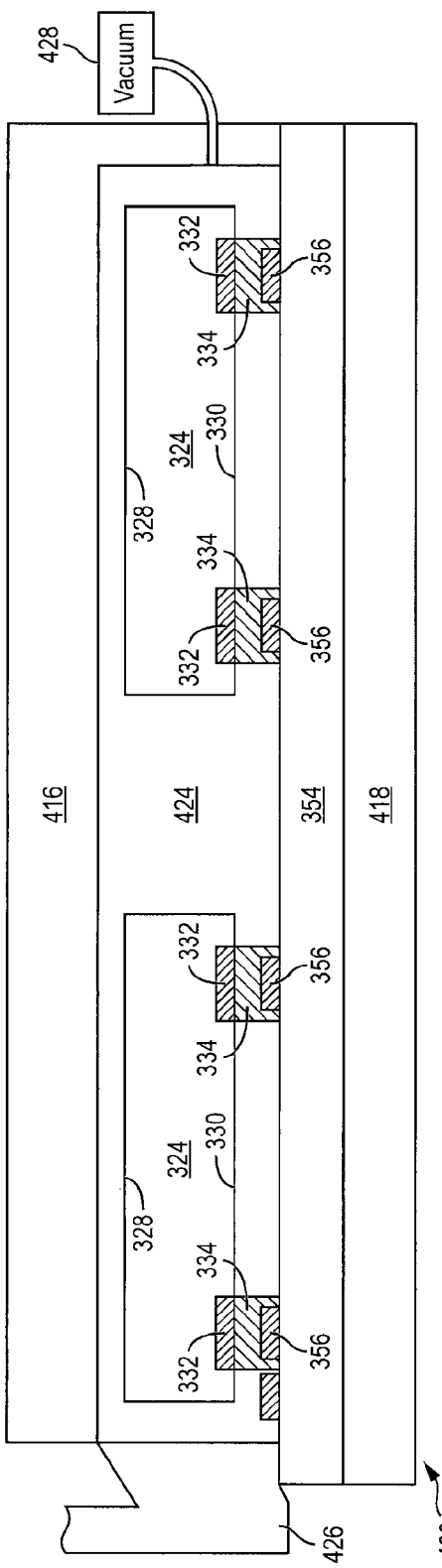

FIGS. 18a-18c show a mold underfill (MUF) process to deposit encapsulant around the bumps between the semiconductor die and substrate. FIG. 18a shows semiconductor die 324 mounted to substrate 354 using bump material 334 from FIG. 13b and placed between upper mold support 416 and lower mold support 418 of chase mold 420. The other semiconductor die and substrate combinations from FIGS. 13a-13g, 14a-14d, 15a-15d, 16a-16c, and 17a-17b can be placed between upper mold support 416 and lower mold support 418 of chase mold 420. The upper mold support 416 includes compressible releasing film 422.

In FIG. 18b, upper mold support 416 and lower mold support 418 are brought together to enclose semiconductor die 324 and substrate 354 with an open space over the substrate and between the semiconductor die and substrate. Compressible releasing film 422 conforms to back surface 328 and side surfaces of semiconductor die 324 to block formation of encapsulant on these surfaces. An encapsulant 424 in a liquid state is injected into one side of chase mold 420 with nozzle 426 while an optional vacuum assist 428 draws pressure from the opposite side to uniformly fill the open space over substrate 354 and the open space between semiconductor die 324 and substrate 354 with the encapsulant. Encapsulant 424 can be polymer composite material, such as epoxy resin with filler, epoxy acrylate with filler, or polymer with proper filler. Encapsulant 424 is non-conductive and environmentally protects the semiconductor device from external elements and contaminants. Compressible material 422 prevents encapsulant 424 from flowing over back surface 328 and around the side surfaces of semiconductor die 324. Encapsulant 424 is cured. The back surface 328 and side surfaces of semiconductor die 324 remain exposed from encapsulant 424.

FIG. 18c shows an embodiment of MUF and mold overfill (MOF), i.e., without compressible material 422. Semiconductor die 324 and substrate 354 are placed between upper mold support 416 and lower mold support 418 of chase mold 420. The upper mold support 416 and lower mold support 418 are brought together to enclose semiconductor die 324 and substrate 354 with an open space over the substrate, around the semiconductor die, and between the semiconductor die and substrate. Encapsulant 424 in a liquid state is injected into one side of chase mold 420 with nozzle 426 while an optional vacuum assist 428 draws pressure from the opposite side to uniformly fill the open space around semiconductor die 324 and over substrate 354 and the open space between semiconductor die 324 and substrate 354 with the encapsulant. Encapsulant 424 is cured.

Figure 19:
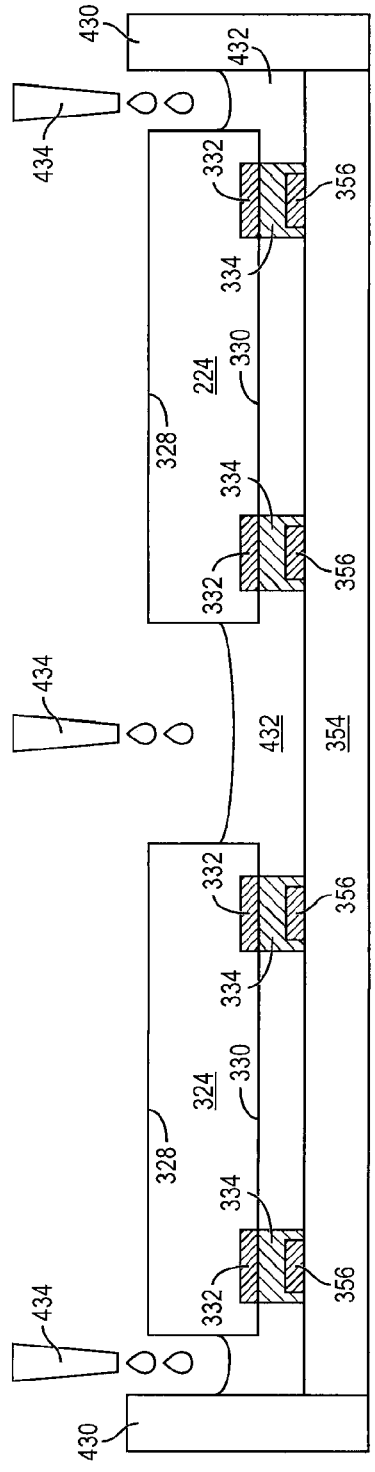
FIG. 19 illustrates another mold underfill between the semiconductor die and substrate.

FIG. 19 shows another embodiment of depositing encapsulant around semiconductor die 324 and in the gap between semiconductor die 324 and substrate 354. Semiconductor die 324 and substrate 354 are enclosed by dam 430. Encapsulant 432 is dispensed from nozzles 434 in a liquid state into dam 430 to fill the open space over substrate 354 and the open space between semiconductor die 324 and substrate 354. The volume of encapsulant 432 dispensed from nozzles 434 is controlled to fill dam 430 without covering back surface 328 or the side surfaces of semiconductor die 324. Encapsulant 432 is cured.

Figure 20:
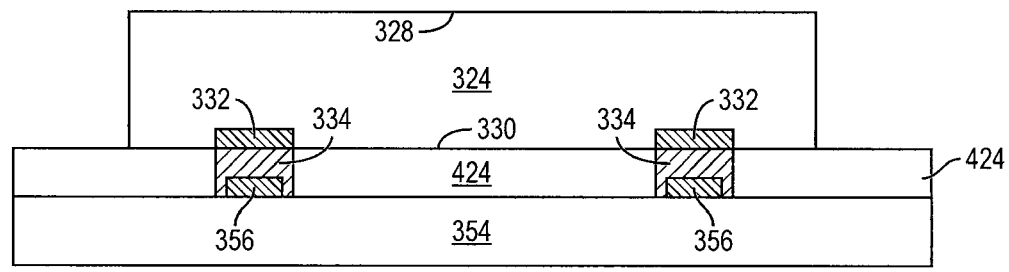
FIG. 20 illustrates the semiconductor die and substrate after mold underfill.

FIG. 20 shows semiconductor die 324 and substrate 354 after the MUF process from FIGS. 18a, 18c, and 19. Encapsulant 424 is uniformly distributed over substrate 354 and around bump material 334 between semiconductor die 324 and substrate 354.

FIGS. 21a-21g show top views of various conductive trace layouts on substrate or PCB 440. In FIG. 21a, conductive trace 442 is a straight conductor with integrated bump pad or interconnect site 444 formed on substrate 440. The sides of substrate bump pad 444 can be co-linear with conductive trace 442. In the prior art, a solder registration opening (SRO) is typically formed over the interconnect site to contain the bump material during reflow. The SRO increases interconnect pitch and reduces I/O count. In contrast, masking layer 446 can be formed over a portion of substrate 440; however, the masking layer is not formed around substrate bump pad 444 of conductive trace 442. That is, the portion of conductive trace 442 designed to mate with the bump material is devoid of any SRO of masking layer 446 that would have been used for bump containment during reflow.

Semiconductor die 324 is placed over substrate 440 and the bump material is aligned with substrate bump pads 444. The bump material is electrically and metallurgically connected to substrate bump pads 444 by bringing the bump material in physical contact with the bump pad and then reflowing the bump material under a reflow temperature.

In another embodiment, an electrically conductive bump material is deposited over substrate bump pad 444 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 444 using a suitable attachment or bonding process. In one embodiment, the bump material is reflowed by heating the material above its melting point to form bump or interconnect 448, as shown in FIG. 21b. In some applications, bump 448 is reflowed a second time to improve electrical contact to substrate bump pad 444. The bump material around the narrow substrate bump pad 444 maintains die placement during reflow.

In high routing density applications, it is desirable to minimize escape pitch of conductive traces 442. The escape pitch between conductive traces 442 can be reduced by eliminating the masking layer for the purpose of reflow containment, i.e., by reflowing the bump material without a masking layer. Since no SRO is formed around die bump pad 332 or substrate bump pad 444, conductive traces 442 can be formed with a finer pitch, i.e., conductive trace 442 can be disposed closer together or to nearby structures. With no SRO around substrate bump pad 444, the pitch between conductive traces 442 is given as $P=D+PLT+W/2$, wherein D is the base diameter of bump 448, PLT is die placement tolerance, and W is the width of conductive trace 442. In one embodiment, given a bump base diameter of 100 μm, PLT of 10 μm, and trace line width of 30 μm, the minimum escape pitch of conductive trace 442 is 125 μm. The mask-less bump formation eliminates the need to account for the ligament spacing of masking material between adjacent openings, solder mask registration tolerance (SRT), and minimum resolvable SRO, as found in the prior art.

When the bump material is reflowed without a masking layer to metallurgically and electrically connect die bump pad 332 to substrate bump pad 444, the wetting and surface tension causes the bump material to maintain self-confinement and be retained within the space between die bump pad 332 and substrate bump pad 444 and portion of substrate 440 immediately adjacent to conductive trace 442 substantially within the footprint of the bump pads.

To achieve the desired self-confinement property, the bump material can be immersed in a flux solution prior to placement on die bump pad 332 or substrate bump pad 444 to selectively render the region contacted by the bump material more wettable than the surrounding area of conductive traces 442. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 440 is not needed around die bump pad 332 or substrate bump pad 444.

FIG. 21c shows another embodiment of parallel conductive traces 452 as a straight conductor with integrated rectangular bump pad or interconnect site 454 formed on substrate 450. In this case, substrate bump pad 454 is wider than conductive trace 452, but less than the width of the mating bump. The sides of substrate bump pad 454 can be parallel to conductive trace 452. Masking layer 456 can be formed over a portion of substrate 450; however, the masking layer is not formed around substrate bump pad 454 of conductive trace 452. That is, the portion of conductive trace 452 designed to mate with the bump material is devoid of any SRO of masking layer 456 that would have been used for bump containment during reflow.

FIG. 21d shows another embodiment of conductive traces 460 and 462 arranged in an array of multiple rows with offset integrated bump pad or interconnect site 464 formed on substrate 466 for maximum interconnect density and capacity. Alternate conductive traces 460 and 462 include an elbow for routing to bump pads 464. The sides of each substrate bump pad 464 is co-linear with conductive traces 460 and 462. Masking layer 468 can be formed over a portion of substrate 466; however, masking layer 468 is not formed around substrate bump pad 464 of conductive traces 460 and 462. That is, the portion of conductive trace 460 and 462 designed to mate with the bump material is devoid of any SRO of masking layer 468 that would have been used for bump containment during reflow.

FIG. 21e shows another embodiment of conductive traces 470 and 472 arranged in an array of multiple rows with offset integrated bump pad or interconnect site 474 formed on substrate 476 for maximum interconnect density and capacity. Alternate conductive traces 470 and 472 include an elbow for routing to bump pads 474. In this case, substrate bump pad 474 is rounded and wider than conductive traces 470 and 472, but less than the width of the mating interconnect bump material. Masking layer 478 can be formed over a portion of substrate 476; however, masking layer 478 is not formed around substrate bump pad 474 of conductive traces 470 and 472. That is, the portion of conductive trace 470 and 472 designed to mate with the bump material is devoid of any SRO of masking layer 478 that would have been used for bump containment during reflow.

FIG. 21f shows another embodiment of conductive traces 480 and 482 arranged in an array of multiple rows with offset integrated bump pad or interconnect site 484 formed on substrate 486 for maximum interconnect density and capacity. Alternate conductive traces 480 and 482 include an elbow for routing to bump pads 484. In this case, substrate bump pad 484 is rectangular and wider than conductive traces 480 and 482, but less than the width of the mating interconnect bump material. Masking layer 488 can be formed over a portion of substrate 486; however, masking layer 488 is not formed around substrate bump pad 484 of conductive traces 480 and 482. That is, the portion of conductive trace 480 and 482 designed to mate with the bump material is devoid of any SRO of masking layer 488 that would have been used for bump containment during reflow.

As one example of the interconnect process, semiconductor die 324 is placed over substrate 466 and bump material 334 is aligned with substrate bump pads 464 from FIG. 21d. Bump material 334 is electrically and metallurgically connected to substrate bump pad 464 by pressing the bump material or by bringing the bump material in physical contact with the bump pad and then reflowing the bump material under a reflow temperature, as described for FIGS. 13a-13g, 14a-14d, 15a-15d, 16a-16c, and 17a-17b.

In another embodiment, an electrically conductive bump material is deposited over substrate bump pad 464 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 464 using a suitable attachment or bonding process. In one embodiment, the bump material is reflowed by heating the material above its melting point to form bump or interconnect 490, as shown in FIG. 21g. In some applications, bump 490 is reflowed a second time to improve electrical contact to substrate bump pad 464. The bump material around the narrow substrate bump pad 464 maintains die placement during reflow. Bump material 334 or bumps 490 can also be formed on substrate bump pad configurations of FIGS. 21a-21g.

In high routing density applications, it is desirable to minimize escape pitch of conductive traces 460 and 462 or other conductive trace configurations of FIGS. 21a-21g. The escape pitch between conductive traces 460 and 462 can be reduced by eliminating the masking layer for the purpose of reflow containment, i.e., by reflowing the bump material without a masking layer. Since no SRO is formed around die bump pad 332 or substrate bump pad 464, conductive traces 460 and 462 can be formed with a finer pitch, i.e., conductive traces 460 and 462 can be disposed closer together or to nearby structures. With no SRO around substrate bump pad 464, the pitch between conductive traces 460 and 462 is given as $P=D/2+PLT+W/2$, wherein D is the base diameter of bump 490, PLT is die placement tolerance, and W is the width of conductive traces 460 and 462. In one embodiment, given a bump base diameter of 100 µm, PLT of 10 µm, and trace line width of 30 µm, the minimum escape pitch of conductive traces 460 and 462 is 125 µm. The mask-less bump formation eliminates the need to account for the ligament spacing of masking material between adjacent openings, SRT, and minimum resolvable SRO, as found in the prior art.

When the bump material is reflowed without a masking layer to metallurgically and electrically connect die bump pad 332 to substrate bump pad 464, the wetting and surface tension causes the bump material to maintain self-confinement and be retained within the space between die bump pad 332 and substrate bump pad 464 and portion of substrate 466 immediately adjacent to conductive traces 460 and 462 substantially within the footprint of the bump pads.

To achieve the desired self-confinement property, the bump material can be immersed in a flux solution prior to placement on die bump pad 332 or substrate bump pad 464 to selectively render the region contacted by the bump material more wettable than the surrounding area of conductive traces 460 and 462. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 468 is not needed around die bump pad 332 or substrate bump pad 464.

Figure 22A:
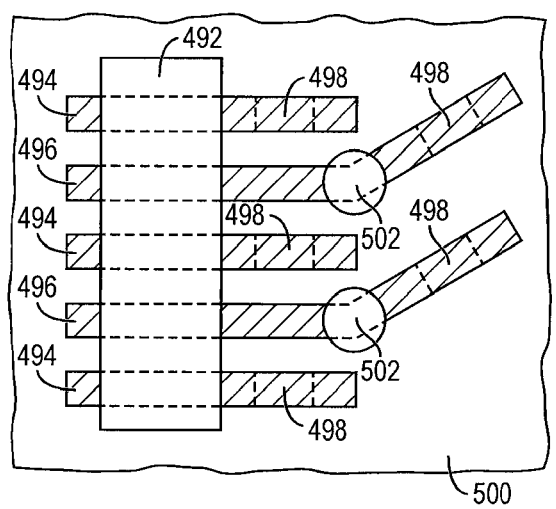
FIGS. 22a-22b illustrate the open solder registration with patches between the conductive traces.
Figure 22B:
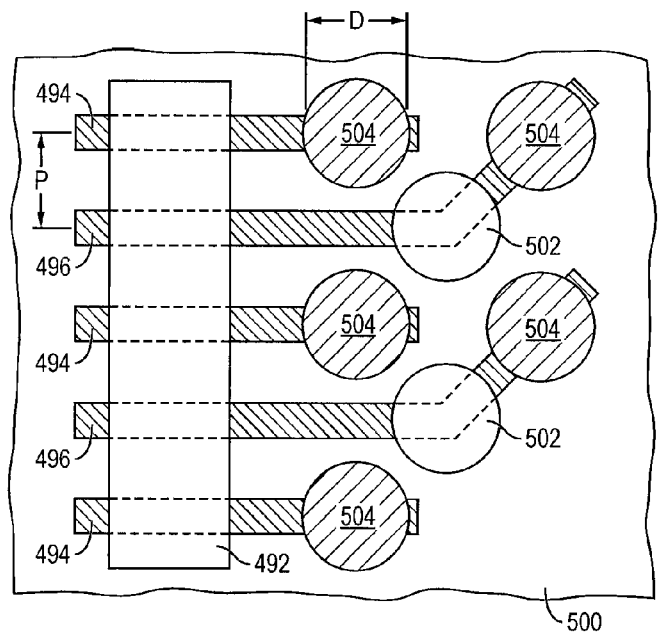

In FIG. 22a, masking layer 492 is deposited over a portion of conductive traces 494 and 496. However, masking layer 492 is not formed over integrated bump pads 498. Consequently, there is no SRO for each bump pad 498 on substrate 500. A non-wettable masking patch 502 is formed on substrate 500 interstitially within the array of integrated bump pads 498, i.e., between adjacent bump pads. The masking patch 502 can also be formed on semiconductor die 324 interstitially within the array of die bump pads 498. More generally, the masking patch is formed in close proximity to the integrated bump pads in any arrangement to prevent run-out to less wettable areas.

Semiconductor die 324 is placed over substrate 500 and the bump material is aligned with substrate bump pads 498. The bump material is electrically and metallurgically connected to substrate bump pad 498 by pressing the bump material or by bringing the bump material in physical contact with the bump pad and then reflowing the bump material under a reflow temperature, as described for FIGS. 13a-13g, 14a-14d, 15a-15d, 16a-16c, and 17a-17b.

In another embodiment, an electrically conductive bump material is deposited over die integrated bump pads 498 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to integrated bump pads 498 using a suitable attachment or bonding process. In one embodiment, the bump material is reflowed by heating the material above its melting point to form spherical balls or bumps 504. In some applications, bumps 504 are reflowed a second time to improve electrical contact to integrated bump pads 498. The bumps can also be compression bonded to integrated bump pads 498. Bumps 504 represent one type of interconnect structure that can be formed over integrated bump pads 498. The interconnect structure can also use stud bump, micro bump, or other electrical interconnect.

In high routing density applications, it is desirable to minimize escape pitch. In order to reduce the pitch between conductive traces 494 and 496, the bump material is reflowed without a masking layer around integrated bump pads 498. The escape pitch between conductive traces 494 and 496 can be reduced by eliminating the masking layer and associated SROs around the integrated bump pads for the purpose of reflow containment, i.e., by reflowing the bump material without a masking layer. Masking layer 492 can be formed over a portion of conductive traces 494 and 496 and substrate 500 away from integrated bump pads 498; however, masking layer 492 is not formed around integrated bump pads 498. That is, the portion of conductive trace 494 and 496 designed to mate with the bump material is devoid of any SRO of masking layer 492 that would have been used for bump containment during reflow.

In addition, masking patch 502 is formed on substrate 500 interstitially within the array of integrated bump pads 498. Masking patch 502 is non-wettable material. Masking patch 502 can be the same material as masking layer 492 and applied during the same processing step, or a different material during a different processing step. Masking patch 502 can be formed by selective oxidation, plating, or other treatment of the portion of the trace or pad within the array of integrated bump pads 498. Masking patch 502 confines bump material flow to integrated bump pads 498 and prevents leaching of conductive bump material to adjacent structures.

When the bump material is reflowed with masking patch 502 interstitially disposed within the array of integrated bump pads 498, the wetting and surface tension causes the bump material to be confined and retained within the space between die bump pads 332 and integrated bump pads 498 and portion of substrate 500 immediately adjacent to conductive traces 494 and 496 and substantially within the footprint of the integrated bump pads 498.

To achieve the desired confinement property, the bump material can be immersed in a flux solution prior to placement on die bump pads 332 or integrated bump pads 498 to selectively render the region contacted by the bump material more wettable than the surrounding area of conductive traces 494 and 496. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 492 is not needed around die bump pads 332 or integrated bump pads 498.

Since no SRO is formed around die bump pads 332 or integrated bump pads 498, conductive traces 494 and 496 can be formed with a finer pitch, i.e., the conductive traces can be disposed closer to adjacent structures without making contact and forming electrical shorts. Assuming the same solder registration design rule, the pitch between conductive traces 494 and 496 is given as $P=(1.1D+W)/2$, where D is the base diameter of bump 504 and W is the width of conductive traces 494 and 496. In one embodiment, given a bump diameter of 100 μm and trace line width of 20 μm, the minimum escape pitch of conductive traces 494 and 496 is 65 μm. The bump formation eliminates the need to account for the ligament spacing of masking material between adjacent openings and minimum resolvable SRO, as found in the prior art.

Figure 23:
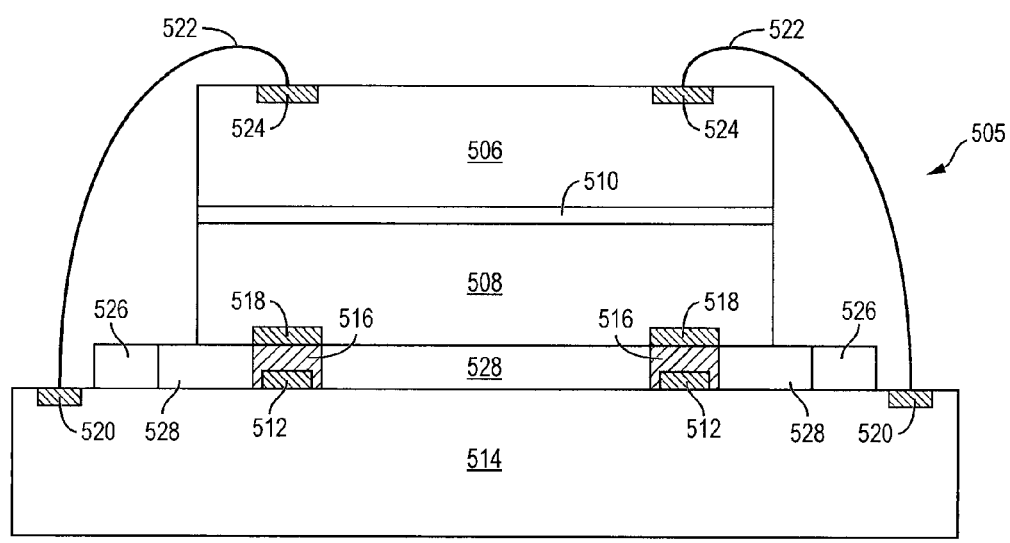
FIG. 23 illustrates a POP with masking layer dam to restrain the encapsulant during mold underfill.

FIG. 23 shows package-on-package (PoP) 505 with semiconductor die 506 stacked over semiconductor die 508 using die attach adhesive 510. Semiconductor die 506 and 508 each have an active surface containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within the active surface to implement analog circuits or digital circuits, such as DSP, ASIC, memory, or other signal processing circuit. Semiconductor die 506 and 508 can also contain IPDs, such as inductors, capacitors, and resistors, for RF signal processing.

Semiconductor die 508 is mounted to conductive traces 512 formed on substrate 514 using bump material 516 formed on contact pads 518, using any of the embodiments from FIGS. 13a-13g, 14a-14d, 15a-15d, 16a-16c, and 17a-17b. Contact pads 518 and conductive traces 512 can correspond to the signal pads, power pads, or ground pads in the die pad layout of FIGS. 5-11. Semiconductor die 506 is electrically connected to contact pads 520 formed on substrate 514 using bond wires 522. The opposite end of bond wire 522 is bonded to contact pads 524 on semiconductor die 506.

Masking layer 526 is formed over substrate 514 and opened beyond the footprint of semiconductor die 506. While masking layer 526 does not confine bump material 516 to conductive traces 512 during reflow, the open mask can operate as a dam to prevent encapsulant 528 from migrating to contact pads 520 or bond wires 522 during MUF. Encapsulant 528 is deposited between semiconductor die 508 and substrate 514, similar to FIGS. 18a-18c. Masking layer 526 blocks MUF encapsulant 528 from reaching contact pads 520 and bond wires 522, which could cause a defect. Masking layer 526 allows a larger semiconductor die to be placed on a given substrate without risk of encapsulant 528 bleeding onto contact pads 520.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die including a die pad layout comprising signal pads located in no more than two peripheral rows in a perimeter region of the semiconductor die, and power pads and ground pads located primarily in an inboard region of the semiconductor die from the signal pads;
    forming a plurality of bumps over the signal pads, power pads, and ground pads of the semiconductor die;
    providing a substrate;
    forming a plurality of conductive traces including interconnect sites disposed over the substrate, the bumps over the signal pads, power pads, and ground pads of the semiconductor die being wider than the interconnect sites of the conductive traces;
    mounting the semiconductor die to the substrate with the bumps over the signal pads, power pads, and ground pads of the semiconductor die being bonded to the interconnect sites over the substrate so that the bumps cover a top surface and side surfaces of the interconnect sites; and
    depositing an encapsulant around the bumps between the semiconductor die and substrate.

2. The method of claim 1, wherein the bumps include a fusible portion and non-fusible portion.

3. The method of claim 1, further including arranging the signal pads in a peripheral array generally parallel to an edge of the semiconductor die.

4. The method of claim 1, further including arranging the signal pads in adjacent rows in a staggered arrangement or orthogonal arrangement.

5. The method of claim 1, wherein fewer than 10% of the power pads and ground pads are located within the perimeter region and fewer than 10% of the signal pads are located within the inboard region.

6. The method of claim 1, further including forming a masking layer over an area of the substrate away from the interconnect sites.

7. A method of making a semiconductor device, comprising:
    providing a semiconductor die;
    providing a substrate;
    forming a plurality of conductive traces including interconnect sites over the substrate arranged in a layout comprising signal sites located in no more than two peripheral rows near a perimeter of the substrate, and power sites and ground sites located inboard from the signal sites over the substrate; and
    forming an interconnect structure between the semiconductor die and substrate so that the interconnect structures cover a top surface and side surfaces of the signal sites, power sites, and ground sites over the substrate.

8. The method of claim 7, further including depositing an encapsulant between the semiconductor die and substrate.

9. The method of claim 7, wherein the interconnect structure includes a fusible portion and non-fusible portion.

10. The method of claim 7, further including arranging the signal sites in a peripheral array generally parallel to an edge of the substrate.

11. The method of claim 7, further including arranging the signal sites in adjacent rows in a staggered arrangement or orthogonal arrangement.

12. The method of claim 7, further including arranging the power and ground sites in an array near a center of the substrate.

13. The method of claim 7, wherein a central region of the semiconductor die has no pads.

14. A method of making a semiconductor device, comprising:
providing a semiconductor die;
providing a substrate;
forming a plurality of conductive traces including interconnect sites on the conductive traces and disposed over the substrate arranged in a layout comprising signal sites located primarily in a perimeter region of the substrate, and power sites and ground sites located primarily in an inboard region of the substrate from the signal sites;
bonding the semiconductor die to the interconnect sites with bumps wider than the interconnect sites on the conductive traces; and
depositing an encapsulant between the semiconductor die and substrate.

15. The method of claim 14, further including forming an interconnect structure over the semiconductor die, the interconnect structure including a fusible portion and non-fusible portion.

16. The method of claim 14, wherein fewer than 10% of the power sites and ground sites are located within the perimeter region.

17. The method of claim 14, wherein fewer than 10% of the signal sites are located within the inboard region.

18. The method of claim 14, further including arranging the signal sites in a peripheral row or in a peripheral array generally parallel to an edge of the substrate.

19. The method of claim 14, further including arranging the power sites and ground sites in an array near a center of the substrate.

20. The method of claim 14, further including arranging the signal sites in adjacent rows in a staggered arrangement or orthogonal arrangement.

21. A semiconductor device, comprising:
a semiconductor die including a die pad layout comprising signal pads located primarily in a perimeter region of the semiconductor die, and power pads and ground pads located primarily in an inboard region of the semiconductor die from the signal pads;
a substrate;
a plurality of conductive traces including interconnect sites formed over the substrate;
interconnects comprising a width greater than a width of the interconnect sites are bonded to the semiconductor die and interconnect sites; and
an encapsulant deposited between the semiconductor die and substrate.

22. The semiconductor device of claim 21, wherein the interconnects include a fusible portion and non-fusible portion.

23. The semiconductor device of claim 21, wherein fewer than 10% of the power pads and ground pads are located within the perimeter region.

24. The semiconductor device of claim 21, wherein the signal pads are arranged in adjacent rows in a staggered arrangement or orthogonal arrangement.

25. The semiconductor device of claim 21, wherein the signal pads are arranged in no more than two rows.

26. A semiconductor device, comprising:
a semiconductor die including a die pad layout comprising signal pads located primarily in a perimeter region of the semiconductor die, and power pads and ground pads located primarily in an inboard region of the semiconductor die from the signal pads;
a substrate;
a plurality of conductive traces including interconnect sites formed over the substrate;
bumps bonded to the semiconductor die and to a top surface and side surfaces of the interconnect sites; and
an encapsulant deposited between the semiconductor die and substrate.

27. The semiconductor device of claim 26, wherein the bumps include a fusible portion and non-fusible portion.

28. The semiconductor device of claim 26, wherein fewer than 10% of the power pads and ground pads are located within the perimeter region.

29. The semiconductor device of claim 26, wherein the signal pads are arranged in adjacent rows in a staggered arrangement or orthogonal arrangement.

30. The semiconductor device of claim 26, wherein the signal pads are arranged in a peripheral row or in a peripheral array generally parallel to an edge of the substrate.

31. The semiconductor device of claim 26, wherein the power pads and ground pads are arranged in an array near a center of the substrate.

* * * * *